United States Patent
Pope et al.

(10) Patent No.: US 9,456,482 B1
(45) Date of Patent: Sep. 27, 2016

(54) DAYLIGHTING FOR DIFFERENT GROUPS OF LIGHTING FIXTURES

(71) Applicant: Cree, Inc., Durham, NC (US)

(72) Inventors: Daniel J. Pope, Morrisville, NC (US); Boris Karpichev, Libertyville, IL (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/681,846

(22) Filed: Apr. 8, 2015

(51) Int. Cl.
*H05B 33/08* (2006.01)
*H05B 37/02* (2006.01)

(52) U.S. Cl.
CPC ...... *H05B 33/0854* (2013.01); *H05B 37/0218* (2013.01); *H05B 37/0272* (2013.01)

(58) Field of Classification Search
CPC .......... H05B 33/0803; H05B 37/0272; H05B 33/0809; H05B 33/0821; H05B 33/0857; H05B 33/0815; H05B 33/0845; H05B 33/0869; H05B 37/0227; H05B 37/0218; H05B 37/0254; H05B 33/0842; H05B 33/0863
See application file for complete search history.

(56) References Cited

U.S. PATENT DOCUMENTS

| | | | |
|---|---|---|---|
| 3,557,380 | A | 1/1971 | Matthews |
| 3,714,435 | A | 1/1973 | Bestenreiner et al. |
| 4,023,034 | A | 5/1977 | Schacht |
| D259,514 | S | 6/1981 | Welch |
| D317,363 | S | 6/1991 | Welch |
| 5,079,680 | A | 1/1992 | Kohn |
| D344,361 | S | 2/1994 | Friedman et al. |
| D349,582 | S | 8/1994 | Bain et al. |
| 5,471,119 | A | 11/1995 | Ranganath et al. |
| D373,438 | S | 9/1996 | McCann-Compton et al. |
| 6,100,643 | A | 8/2000 | Nilssen |
| 6,118,230 | A | 9/2000 | Fleischmann |
| 6,137,408 | A | 10/2000 | Okada |
| 6,160,359 | A | 12/2000 | Fleischmann |
| 6,166,496 | A | 12/2000 | Lys et al. |
| 6,437,692 | B1 | 8/2002 | Petite et al. |
| 6,528,954 | B1 | 3/2003 | Lys et al. |
| 6,553,218 | B1 | 4/2003 | Boesjes |
| 6,735,630 | B1 | 5/2004 | Gelvin et al. |
| 6,804,790 | B2 | 10/2004 | Rhee et al. |

(Continued)

FOREIGN PATENT DOCUMENTS

| | | |
|---|---|---|
| AT | 492840 T | 1/2011 |
| AU | 3666702 A | 5/2002 |

(Continued)

OTHER PUBLICATIONS

Non-Final Office Action for U.S. Appl. No. 14/292,286, mailed Nov. 19, 2015, 16 pages.

(Continued)

*Primary Examiner* — Jany Richardson
(74) *Attorney, Agent, or Firm* — Withrow & Terranova, P.L.L.C.

(57) ABSTRACT

Assume that the two groups of lighting fixtures are located in the same general area, employ daylighting, and provide light that can be sensed by each other. A first group will determine an actual lighting contribution provided by the second group and remove the actual lighting contribution provided by the second group when making daylighting decisions. As such, when the dimming level of the second group is changed, the first group will effectively ignore changes in the dimming level of the second group when making daylighting decisions, and vice versa. A group of lighting fixtures may include one or more lighting fixtures.

21 Claims, 21 Drawing Sheets

(56) References Cited

U.S. PATENT DOCUMENTS

| | | |
|---|---|---|
| 6,826,607 B1 | 11/2004 | Gelvin et al. |
| 6,832,251 B1 | 12/2004 | Gelvin et al. |
| 6,859,831 B1 | 2/2005 | Gelvin et al. |
| 6,914,893 B2 | 7/2005 | Petite |
| 6,975,851 B2 | 12/2005 | Boesjes |
| 6,990,394 B2 | 1/2006 | Pasternak |
| 7,009,348 B2 | 3/2006 | Mogilner et al. |
| 7,020,701 B1 | 3/2006 | Gelvin et al. |
| 7,031,920 B2 | 4/2006 | Dowling et al. |
| 7,103,511 B2 | 9/2006 | Petite |
| 7,305,467 B2 | 12/2007 | Kaiser et al. |
| 7,313,399 B2 | 12/2007 | Rhee et al. |
| D560,006 S | 1/2008 | Garner et al. |
| 7,344,279 B2 | 3/2008 | Mueller et al. |
| D565,771 S | 4/2008 | Garner et al. |
| D567,431 S | 4/2008 | Garner et al. |
| 7,391,297 B2 | 6/2008 | Cash et al. |
| D582,598 S | 12/2008 | Kramer et al. |
| 7,468,661 B2 | 12/2008 | Petite et al. |
| 7,482,567 B2 | 1/2009 | Hoelen et al. |
| 7,484,008 B1 | 1/2009 | Gelvin et al. |
| D586,950 S | 2/2009 | Garner et al. |
| D587,390 S | 2/2009 | Garner et al. |
| D588,064 S | 3/2009 | Garner et al. |
| 7,522,563 B2 | 4/2009 | Rhee |
| D594,576 S | 6/2009 | Chan et al. |
| 7,606,572 B2 | 10/2009 | Rhee et al. |
| 7,657,249 B2 | 2/2010 | Boesjes |
| 7,683,301 B2 | 3/2010 | Papamichael et al. |
| 7,697,492 B2 | 4/2010 | Petite |
| 7,797,367 B1 | 9/2010 | Gelvin et al. |
| 7,844,308 B2 | 11/2010 | Rhee et al. |
| 7,844,687 B1 | 11/2010 | Gelvin et al. |
| 7,891,004 B1 | 2/2011 | Gelvin et al. |
| 7,904,569 B1 | 3/2011 | Gelvin et al. |
| 7,924,174 B1 | 4/2011 | Gananathan |
| 7,924,927 B1 | 4/2011 | Boesjes |
| 7,926,300 B2 | 4/2011 | Roberts et al. |
| 7,948,930 B2 | 5/2011 | Rhee |
| 8,021,021 B2 | 9/2011 | Paolini |
| 8,035,320 B2 | 10/2011 | Sibert |
| 8,079,118 B2 | 12/2011 | Gelvin et al. |
| 8,098,615 B2 | 1/2012 | Rhee |
| 8,126,429 B2 | 2/2012 | Boesjes |
| 8,140,658 B1 | 3/2012 | Gelvin et al. |
| D663,048 S | 7/2012 | Chen |
| 8,228,163 B2 | 7/2012 | Cash |
| 8,271,058 B2 | 9/2012 | Rhee et al. |
| 8,274,928 B2 | 9/2012 | Dykema et al. |
| 8,275,471 B2 | 9/2012 | Huizenga et al. |
| 8,344,660 B2 | 1/2013 | Mohan et al. |
| 8,364,325 B2 | 1/2013 | Huizenga et al. |
| 8,461,781 B2 | 6/2013 | Schenk et al. |
| 8,466,626 B2 | 6/2013 | Null et al. |
| 8,497,634 B2 | 7/2013 | Scharf |
| 8,511,851 B2 | 8/2013 | Van de Ven et al. |
| 8,536,505 B2 | 9/2013 | Page |
| 8,536,792 B1 | 9/2013 | Roosli |
| 8,536,984 B2 | 9/2013 | Benetz et al. |
| 8,604,714 B2 | 12/2013 | Mohan et al. |
| 8,610,377 B2 | 12/2013 | Chemel et al. |
| D703,841 S | 4/2014 | Feng et al. |
| D708,360 S | 7/2014 | Shibata et al. |
| 8,829,800 B2 | 9/2014 | Harris |
| 8,829,821 B2 | 9/2014 | Chobot et al. |
| 8,912,735 B2 | 12/2014 | Chobot et al. |
| 9,041,315 B2 | 5/2015 | Cho et al. |
| 2002/0195975 A1 | 12/2002 | Schanberger et al. |
| 2003/0185009 A1 | 10/2003 | Walters |
| 2004/0002792 A1 | 1/2004 | Hoffknecht |
| 2004/0193741 A1 | 9/2004 | Pereira et al. |
| 2004/0201835 A1 | 10/2004 | Coates et al. |
| 2005/0127381 A1 | 6/2005 | Vitta et al. |
| 2005/0132080 A1 | 6/2005 | Rhee et al. |
| 2005/0277071 A1 | 12/2005 | Yee |
| 2006/0007170 A1 | 1/2006 | Wilson et al. |
| 2006/0022214 A1 | 2/2006 | Morgan et al. |
| 2006/0044152 A1 | 3/2006 | Wang |
| 2006/0066266 A1 | 3/2006 | Li Lim et al. |
| 2006/0125426 A1 | 6/2006 | Veskovic et al. |
| 2006/0262545 A1 | 11/2006 | Piepgras et al. |
| 2007/0085700 A1 | 4/2007 | Walters et al. |
| 2007/0132405 A1 | 6/2007 | Hillis et al. |
| 2007/0185675 A1 | 8/2007 | Papamichael et al. |
| 2007/0189000 A1 | 8/2007 | Papamichael et al. |
| 2007/0291483 A1 | 12/2007 | Lys |
| 2008/0031213 A1 | 2/2008 | Kaiser et al. |
| 2008/0088435 A1 | 4/2008 | Cash et al. |
| 2008/0121442 A1 | 5/2008 | Boer et al. |
| 2008/0197790 A1 | 8/2008 | Mangiaracina et al. |
| 2008/0218087 A1 | 9/2008 | Crouse et al. |
| 2008/0265799 A1 | 10/2008 | Sibert |
| 2009/0021955 A1 | 1/2009 | Kuang et al. |
| 2009/0026966 A1 | 1/2009 | Budde et al. |
| 2009/0141499 A1 | 6/2009 | Fabbri et al. |
| 2009/0184616 A1 | 7/2009 | Van De Ven et al. |
| 2009/0212718 A1 | 8/2009 | Kawashima et al. |
| 2009/0231832 A1 | 9/2009 | Zukauskas et al. |
| 2009/0284169 A1 | 11/2009 | Valois |
| 2009/0284184 A1 | 11/2009 | Valois et al. |
| 2009/0294671 A1 | 12/2009 | Baghai |
| 2009/0302994 A1 | 12/2009 | Rhee et al. |
| 2009/0302996 A1 | 12/2009 | Rhee et al. |
| 2009/0305644 A1 | 12/2009 | Rhee et al. |
| 2009/0315485 A1 | 12/2009 | Verfuerth et al. |
| 2009/0315668 A1 | 12/2009 | Leete, III et al. |
| 2010/0007289 A1 | 1/2010 | Budike, Jr. |
| 2010/0045191 A1 | 2/2010 | Aendekerk |
| 2010/0084992 A1 | 4/2010 | Valois et al. |
| 2010/0128634 A1 | 5/2010 | Rhee et al. |
| 2010/0134051 A1 | 6/2010 | Huizenga et al. |
| 2010/0148940 A1 | 6/2010 | Gelvin et al. |
| 2010/0150122 A1 | 6/2010 | Berger et al. |
| 2010/0171442 A1 | 7/2010 | Draper et al. |
| 2010/0201516 A1 | 8/2010 | Gelvin et al. |
| 2010/0203515 A1 | 8/2010 | Rigler |
| 2010/0262297 A1 | 10/2010 | Shloush et al. |
| 2010/0270935 A1 | 10/2010 | Otake et al. |
| 2010/0295473 A1 | 11/2010 | Chemel et al. |
| 2010/0301773 A1 | 12/2010 | Chemel et al. |
| 2010/0301774 A1 | 12/2010 | Chemel et al. |
| 2010/0308664 A1 | 12/2010 | Face et al. |
| 2010/0308737 A1 | 12/2010 | Hilgers |
| 2011/0031897 A1 | 2/2011 | Henig et al. |
| 2011/0035491 A1 | 2/2011 | Gelvin et al. |
| 2011/0057581 A1 | 3/2011 | Ashar et al. |
| 2011/0080120 A1 | 4/2011 | Talstra et al. |
| 2011/0101871 A1 | 5/2011 | Schenk et al. |
| 2011/0115386 A1 | 5/2011 | Delnoij |
| 2011/0133655 A1 | 6/2011 | Recker et al. |
| 2011/0137757 A1 | 6/2011 | Paolini et al. |
| 2011/0156596 A1 | 6/2011 | Salsbury |
| 2011/0178650 A1 | 7/2011 | Picco |
| 2011/0199004 A1 | 8/2011 | Henig et al. |
| 2011/0215725 A1 | 9/2011 | Paolini |
| 2011/0221350 A1* | 9/2011 | Staab ............... H05B 37/0218 315/154 |
| 2011/0249441 A1 | 10/2011 | Donegan |
| 2011/0254554 A1 | 10/2011 | Harbers |
| 2011/0298598 A1 | 12/2011 | Rhee |
| 2012/0013257 A1 | 1/2012 | Sibert |
| 2012/0026733 A1 | 2/2012 | Graeber et al. |
| 2012/0040606 A1 | 2/2012 | Verfuerth |
| 2012/0079149 A1 | 3/2012 | Gelvin et al. |
| 2012/0082062 A1 | 4/2012 | Mccormack |
| 2012/0086345 A1 | 4/2012 | Tran |
| 2012/0087290 A1 | 4/2012 | Rhee et al. |
| 2012/0091915 A1 | 4/2012 | Ilyes et al. |
| 2012/0098437 A1 | 4/2012 | Smed |
| 2012/0130544 A1 | 5/2012 | Mohan et al. |
| 2012/0136485 A1 | 5/2012 | Weber et al. |
| 2012/0139426 A1 | 6/2012 | Ilyes et al. |
| 2012/0147604 A1 | 6/2012 | Farmer |
| 2012/0147808 A1 | 6/2012 | Rhee |

(56) References Cited

U.S. PATENT DOCUMENTS

| | | |
|---|---|---|
| 2012/0153840 A1 | 6/2012 | Dahlen et al. |
| 2012/0161643 A1 | 6/2012 | Henig et al. |
| 2012/0176041 A1 | 7/2012 | Birru |
| 2012/0206050 A1 | 8/2012 | Spero |
| 2012/0223657 A1 | 9/2012 | Van de Ven |
| 2012/0229048 A1 | 9/2012 | Archer |
| 2012/0230696 A1 | 9/2012 | Pederson et al. |
| 2012/0235579 A1 | 9/2012 | Chemel et al. |
| 2012/0235600 A1 | 9/2012 | Simonian et al. |
| 2012/0242242 A1 | 9/2012 | Linz et al. |
| 2012/0242254 A1 | 9/2012 | Kim et al. |
| 2012/0271477 A1 | 10/2012 | Okubo et al. |
| 2012/0299485 A1 | 11/2012 | Mohan et al. |
| 2012/0306377 A1 | 12/2012 | Igaki et al. |
| 2013/0002157 A1 | 1/2013 | van de Ven et al. |
| 2013/0002167 A1 | 1/2013 | Van de Ven |
| 2013/0013091 A1 | 1/2013 | Cavalcanti et al. |
| 2013/0026953 A1 | 1/2013 | Woytowitz |
| 2013/0049598 A1 | 2/2013 | Nagashima et al. |
| 2013/0049606 A1 | 2/2013 | Ferstl et al. |
| 2013/0058258 A1 | 3/2013 | Boesjes |
| 2013/0063042 A1 | 3/2013 | Bora et al. |
| 2013/0069539 A1 | 3/2013 | So |
| 2013/0075484 A1 | 3/2013 | Rhee et al. |
| 2013/0077299 A1 | 3/2013 | Hussell et al. |
| 2013/0088168 A1 | 4/2013 | Mohan et al. |
| 2013/0093328 A1 | 4/2013 | Ivey et al. |
| 2013/0107536 A1 | 5/2013 | Hiraoka et al. |
| 2013/0154831 A1 | 6/2013 | Gray et al. |
| 2013/0155392 A1 | 6/2013 | Barrilleaux et al. |
| 2013/0155672 A1 | 6/2013 | Vo et al. |
| 2013/0200805 A1 | 8/2013 | Scapa et al. |
| 2013/0221857 A1 | 8/2013 | Bowers |
| 2013/0229784 A1 | 9/2013 | Lessard et al. |
| 2013/0234008 A1 | 9/2013 | Steiner |
| 2013/0320862 A1* | 12/2013 | Campbell .............. H05B 37/02 315/152 |
| 2013/0328486 A1* | 12/2013 | Jones .................... H05B 37/02 315/151 |
| 2013/0342911 A1 | 12/2013 | Bartol et al. |
| 2014/0001952 A1 | 1/2014 | Harris et al. |
| 2014/0001959 A1 | 1/2014 | Motley et al. |
| 2014/0001962 A1 | 1/2014 | Harris |
| 2014/0001963 A1 | 1/2014 | Chobot et al. |
| 2014/0001977 A1 | 1/2014 | Zacharchuk et al. |
| 2014/0167646 A1 | 6/2014 | Zukauskas et al. |
| 2014/0175985 A1 | 6/2014 | Billig et al. |
| 2014/0212090 A1 | 7/2014 | Wilcox et al. |
| 2014/0232299 A1 | 8/2014 | Wang |
| 2014/0268790 A1 | 9/2014 | Chobot et al. |
| 2015/0008829 A1 | 1/2015 | Lurie et al. |
| 2015/0022096 A1* | 1/2015 | Deixler ............. H05B 37/0218 315/153 |
| 2015/0042243 A1 | 2/2015 | Picard |
| 2015/0145418 A1 | 5/2015 | Pope |
| 2016/0029464 A1 | 1/2016 | Hughes et al. |

FOREIGN PATENT DOCUMENTS

| | | |
|---|---|---|
| AU | 2002219810 A8 | 5/2002 |
| AU | 2002352922 A1 | 6/2003 |
| CA | 2426769 A1 | 5/2002 |
| CA | 2511368 A1 | 5/2002 |
| CN | 101461151 A | 6/2009 |
| CN | 102119507 A | 7/2011 |
| DE | 60143707 D1 | 2/2011 |
| DE | 102010022477 A1 | 12/2011 |
| EP | 1330699 A1 | 7/2003 |
| EP | 1334608 A2 | 8/2003 |
| EP | 1461907 A1 | 9/2004 |
| EP | 1719363 A2 | 11/2006 |
| EP | 1821581 A2 | 8/2007 |
| EP | 1886415 A2 | 2/2008 |
| EP | 2304311 A1 | 4/2011 |
| EP | 2327184 A1 | 6/2011 |
| EP | 2440017 A2 | 4/2012 |
| EP | 2594846 A1 | 5/2013 |
| HK | 1114508 | 10/2008 |
| IN | 4576/KLONP/2007 | 7/2007 |
| JP | H11345690 A | 12/1999 |
| JP | 2005510956 A | 4/2005 |
| JP | 3860116 B2 | 12/2006 |
| JP | 3896573 B2 | 3/2007 |
| JP | 2010073611 A | 4/2010 |
| JP | 2011526414 A | 10/2011 |
| JP | 2012059474 A | 3/2012 |
| KR | 20080025095 A | 3/2008 |
| WO | 0126068 A1 | 4/2001 |
| WO | 0126327 A2 | 4/2001 |
| WO | 0126328 A2 | 4/2001 |
| WO | 0126329 A2 | 4/2001 |
| WO | 0126331 A2 | 4/2001 |
| WO | 0126332 A2 | 4/2001 |
| WO | 0126333 A2 | 4/2001 |
| WO | 0126334 A2 | 4/2001 |
| WO | 0126335 A2 | 4/2001 |
| WO | 0126338 A2 | 4/2001 |
| WO | 0239242 A1 | 5/2002 |
| WO | 0241604 A2 | 5/2002 |
| WO | 03047175 A1 | 6/2003 |
| WO | 2004109966 A2 | 12/2004 |
| WO | 2006130662 A2 | 12/2006 |
| WO | 2007102097 A1 | 9/2007 |
| WO | 2009011898 A2 | 1/2009 |
| WO | 2009145747 A1 | 12/2009 |
| WO | 2009151416 A1 | 12/2009 |
| WO | 2009158514 A1 | 12/2009 |
| WO | 2010122457 A2 | 10/2010 |
| WO | 2011087681 A1 | 7/2011 |
| WO | 2011090938 A1 | 7/2011 |
| WO | 2011152968 A1 | 12/2011 |
| WO | 2012008262 A1 | 1/2012 |
| WO | 2012112813 A2 | 8/2012 |
| WO | 2012125502 A2 | 9/2012 |
| WO | 2013050970 A1 | 4/2013 |
| WO | 2014120971 A1 | 8/2014 |

OTHER PUBLICATIONS

Non-Final Office Action for U.S. Appl. No. 14/292,363, mailed Nov. 19, 2015, 9 pages.
Non-Final Office Action for U.S. Appl. No. 14/292,332, mailed Dec. 3, 2015, 18 pages.
Applicant-Initiated Interview Summary for U.S. Appl. No. 14/287,812, mailed Jan. 5, 2016, 4 pages.
Notice of Allowance for U.S. Appl. No. 13/782,068, mailed Oct. 1, 2015, 7 pages.
Non-Final Office Action for U.S. Appl. No. 14/287,812, mailed Oct. 23, 2015, 9 pages.
International Preliminary Report on Patentability for PCT/US2014/023889, mailed Sep. 24, 2015, 17 pages.
Notice of Allowance for U.S. Appl. No. 13/782,022, mailed Apr. 27, 2015, 8 pages.
Notice of Allowance for U.S. Appl. No. 13/782,053, mailed Apr. 2, 2015, 8 pages.
Notice of Allowance for U.S. Appl. No. 29/452,813, mailed Mar. 18, 2015, 7 pages.
Supplemental Notice of Allowability for U.S. Appl. No. 29/452,813, mailed May 1, 2015, 4 pages.
Non-Final Office Action for U.S. Appl. No. 13/868,021, mailed Apr. 17, 2015, 10 pages.
Non-Final Office Action for U.S. Appl. No. 13/719,786, mailed Apr. 21, 2015, 13 pages.
International Search Report and Written Opinion for PCT/US2015/010050, mailed Mar. 24, 2015, 10 pages.
Non-Final Office Action for U.S. Appl. No. 13/838,398, mailed Jun. 26, 2015, 15 pages.
Non-Final Office Action for U.S. Appl. No. 14/087,308, mailed Jul. 31, 2015, 36 pages.
Notice of Allowance for U.S. Appl. No. 13/782,022, mailed Jul. 22, 2015, 8 pages.

(56) References Cited

OTHER PUBLICATIONS

International Preliminary Report on Patentability for PCT/US2013/075723, mailed Jul. 2, 2015, 6 pages.
International Preliminary Report on Patentability for PCT/US2013/075729, mailed Jul. 2, 2015, 6 pages.
Notice of Allowance for U.S. Appl. No. 13/782,053, mailed Jul. 17, 2015, 8 pages.
International Preliminary Report on Patentability for PCT/US2013/075737, mailed Jul. 2, 2015, 7 pages.
International Preliminary Report on Patentability for PCT/US2013/075742, mailed Jul. 2, 2015, 7 pages.
International Preliminary Report on Patentability for PCT/US2013/075748, mailed Jul. 2, 2015, 5 pages.
International Preliminary Report on Patentability for PCT/US2013/075754, mailed Jul. 2, 2015, 5 pages.
International Preliminary Report on Patentability for PCT/US2013/075761, mailed Jul. 2, 2015, 5 pages.
Final Office Action for U.S. Appl. No. 13/868,021, mailed Jul. 23, 2015, 11 pages.
Non-Final Office Action for U.S. Appl. No. 13/719,786, mailed Sep. 18, 2015, 16 pages.
International Preliminary Report on Patentability for PCT/US2013/075777, mailed Jul. 2, 2015, 10 pages.
International Search Report and Written Opinion for PCT/US2015/032431, mailed Jul. 24, 2015, 11 pages.
Notice of Allowance for U.S. Appl. No. 29/452,813, mailed Sep. 3, 2015, 7 pages.
Author Unknown, "Cluster Analysis", Wikipedia—the free encyclopedia, Updated May 21, 2013, Retrieved on May 30, 2013, http://en.wikipedia.org/wiki/cluster_analysis, 16 pages.
Author Unknown, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications—Amendment: Data Terminal Equipment (DTE) Power via Media Dependent Interface (MDI)," Standard 802.3af-2003, Jun. 18, 2003, The Institute of Electrical and Electronics Engineers, Inc., 133 pages.
Author Unknown, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications—Amendment 3: Data Terminal Equipment (DTE) Power via the Media Dependent Interface (MDI) Enhancements," Standard 802.3at-2009, Sep. 11, 2009, The Institute of Electrical and Electronics Engineers, Inc., 141 pages.
Author Unknown, "Multi-Agent System", Wikipedia—the free encyclopedia, Updated Apr. 18, 2013, Retrieved May 30, 2013, http://en.wikipedia.org/wiki/multi-agent_system, 7 pages.
Author Unknown, i2C-Bus: What's That?, Updated 2012, Retrieved May 30, 2013, http://www.i2c-bus.org, 1 page.
Kuhn, Fabian et al., "Initializing Newly Deployed Ad Hoc & Sensor Network", The Tenth Annual International Conference on Mobile Computing and Networking (MobiCom '04), Sep. 26-Oct. 4, 2004, 15 pages, Philadelphia, PA.
Teasdale, Dana et al., "Annual Technical Progress Report: Adapting Wireless Technology to Lighting Control and Environmental Sensing," Dust Networks, Aug. 1, 2004, 41 pages.
Non-Final Office Action for U.S. Appl. No. 13/782,022, mailed Nov. 14, 2014, 14 pages.
International Search Report and Written Opinion for PCT/US2013/075723, mailed May 9, 2014, 8 pages.
Non-Final Office Action for U.S. Appl. No. 13/782,040, mailed May 8, 2013, 10 pages.
Final Office Action for U.S. Appl. No. 13/782,040, mailed Oct. 18, 2013, 16 pages.
Non-Final Office Action for U.S. Appl. No. 13/782,040, mailed Feb. 11, 2014, 10 pages.
Notice of Allowance for U.S. Appl. No. 13/782,040 mailed Jul. 23, 2014, 8 pages.
Notice of Allowance for U.S. Appl. No. 13/782,040 mailed Nov. 17, 2014, 8 pages.
International Search Report and Written Opinion for International Application PCT/US2013/075729, mailed Apr. 29, 2014, 8 pages.
Non-Final Office Action for U.S. Appl. No. 13/782,053, mailed Nov. 14, 2014, 11 pages.
Invitation to Pay Additional Fees and Partial International Search for PCT/US2013/075737, mailed May 13, 2014, 5 pages.
International Search Report and Written Opinion for PCT/US2013/075737, mailed Aug. 27, 2014, 11 pages.
Non-Final Office Action for U.S. Appl. No. 13/782,068, mailed Jul. 16, 2013, 6 pages.
Notice of Allowance for U.S. Appl. No. 13/782,068, mailed Oct. 22, 2013, 9 pages.
Non-Final Office Action for U.S. Appl. No. 13/782,068, mailed Nov. 15, 2013, 5 pages.
Final Office Action for U.S. Appl. No. 13/782,068, mailed Mar. 7, 2014, 7 pages.
Notice of Allowance for U.S. Appl. No. 13/782,068, mailed May 12, 2014, 7 pages.
Non-Final Office Action for U.S. Appl. No. 13/782,068, mailed Aug. 15, 2014, 6 pages.
Invitation to Pay Additional Fees and Partial International Search for PCT/US2013/075742, mailed May 14, 2014, 6 pages.
International Search Report and Written Opinion for PCT/US2013/075742, mailed Aug. 27, 2014, 11 pages.
Quayle Action for U.S. Appl. No. 13/782,078, mailed Jun. 12, 2013, 4 pages.
Notice of Allowance for U.S. Appl. No. 13/782,078, mailed Sep. 16, 2013, 7 pages.
Supplemental Notice of Allowability for U.S. Appl. No. 13/782,078, mailed Sep. 27, 2013, 2 pages.
International Search Report and Written Opinion for PCT/US2013/075748, mailed May 9, 2014, 7 pages.
Non-Final Office Action for U.S. Appl. No. 13/782,096, mailed Jun. 10, 2013, 12 pages.
Final Office Action for U.S. Appl. No. 13/782,096, mailed Nov. 18, 2013, 15 pages.
Advisory Action for U.S. Appl. No. 13/782,096, mailed Jan. 27, 2014, 3 pages.
Examiner's Answer to the Appeal Brief for U.S. Appl. No. 13/782,096, mailed Jul. 7, 2014, 17 pages.
International Search Report and Written Opinion for PCT/US2013/075754, mailed May 15, 2014, 8 pages.
Non-Final Office Action for U.S. Appl. No. 13/782,131, mailed May 28, 2013, 10 pages.
Non-Final Office Action for U.S. Appl. No. 13/782,131, mailed Nov. 6, 2013, 8 pages.
Notice of Allowance for U.S. Appl. No. 13/782,131, mailed Feb. 20, 2014, 9 pages.
Notice of Allowance for U.S. Appl. No. 13/782,131, mailed Jun. 5, 2014, 5 pages.
Notice of Allowance for U.S. Appl. No. 13/782,131, mailed Oct. 28, 2014, 5 pages.
International Search Report and Written Opinion for PCT/US2013/075761, mailed May 15, 2014, 7 pages.
Requirement for Restriction/Election for U.S. Appl. No. 29/452,813, mailed Nov. 21, 2014, 6 pages.
Non-Final Office Action for U.S. Appl. No. 13/719,786, mailed Mar. 6, 2014, 12 pages.
Final Office Action for U.S. Appl. No. 13/719,786, mailed Jul. 29, 2014, 14 pages.
Non-Final Office Action for U.S. Appl. No. 13/719,786, mailed Nov. 20, 2014, 16 pages.
Invitation to Pay Additional Fees and Partial International Search Report for PCT/US2013/075777, mailed Jun. 5, 2014, 6 pages.
International Search Report and Written Opinion for PCT/US2013/075777, mailed Aug. 12, 2014, 14 pages.
International Search Report and Written Opinion for PCT/US2014/023889, mailed Jun. 26, 2014, 22 pages.

(56) References Cited

OTHER PUBLICATIONS

Invitation to Pay Additional Fees and Partial Search for PCT/US2014/064305, mailed Feb. 11, 2015, 5 pages.
International Search Report and Written Opinion for PCT/US2014/064305, mailed Apr. 17, 2015, 16 pages.
Examination Report for European Patent Application No. 13818895.8, mailed Mar. 11, 2016, 3 pages.
Non-Final Office Action for U.S. Appl. No. 13/838,398, mailed Jan. 21, 2016, 13 pages.
Final Office Action for U.S. Appl. No. 14/087,308, mailed Feb. 12, 2016, 40 pages.
Final Office Action for U.S. Appl. No. 14/292,286, mailed Apr. 14, 2016, 16 pages.
Notice of Allowance for U.S. Appl. No. 14/292,363, mailed Apr. 4, 2016, 7 pages.
Non-Final Office Action for U.S. Appl. No. 14/498,168, mailed Mar. 29, 2016, 15 pages.
Non-Final Office Action for U.S. Appl. No. 14/498,119, mailed Mar. 18, 2016, 21 pages.
Non-Final Office Action for U.S. Appl. No. 14/498,219, mailed Apr. 15, 2016, 17 pages.
Advisory Action for U.S. Appl. No. 14/087,308, mailed May 23, 2016, 3 pages.
Notice of Allowance for U.S. Appl. No. 13/782,068, mailed Jun. 3, 2016, 7 pages.
Non-Final Office Action for U.S. Appl. No. 13/868,021, mailed Jun. 27, 2016, 9 pages.
Final Office Action for U.S. Appl. No. 13/719,786, mailed Apr. 28, 2016, 19 pages.
Non-Final Office Action for U.S. Appl. No. 14/588,762, mailed Jun. 23, 2016, 12 pages.
Advisory Action for U.S. Appl. No. 14/292,286, mailed Jun. 20, 2016, 3 pages.
Final Office Action for U.S. Appl. No. 14/292,332, mailed May 12, 2016, 21 pages.
Final Office Action for U.S. Appl. No. 14/287,812, mailed May 6, 2016, 11 pages.
Non-Final Office Action for U.S. Appl. No. 14/498,147, mailed May 24, 2016, 15 pages.
Non-Final Office Action for U.S. Appl. No. 14/498,197, mailed Apr. 26, 2016, 21 pages.
Non-Final Office Action for U.S. Appl. No. 14/725,687, mailed Jun. 30, 2016, 18 pages.
Examination Report for European Patent Application No. 13814809.3, mailed Apr. 29, 2016, 5 pages.
First Office Action for Chinese Patent Application 201380073247.X, mailed May 17, 2016, 18 pages.
Examination Report for European Patent Application No. 13814810.1, mailed May 24, 2016, 4 pages.
Communication under Rule 164(2)(a) EPC for European Patent Application No. 13821549.6, mailed May 2, 2016, 4 pages.
Examination Report for European Patent Application No. 13821550A, mailed May 2, 2016, 4 pages.
Examination Report for European Patent Application No. 13821552.0, mailed May 2, 2016, 4 pages.
International Search Report for International Patent Application No. PCT/US2016/024426, mailed Jun. 23, 2016, 11 pages.
International Preliminary Report on Patentability for PCT/US2014/064305, mailed Jun. 2, 2016, 11 pages.
Final Office Action for U.S. Appl. No. 13/838,398, mailed Jul. 18, 2016, 13 pages.
Decision on Appeal for U.S. Appl. No. 13/782,096, mailed Jul. 8, 2016, 14 pages.
Advisory Action for U.S. Appl. No. 14/292,332, mailed Jul. 14, 2016, 3 pages.
Advisory Action for U.S. Appl. No. 14/287,812, mailed Jul. 14, 2016, 3 pages.

* cited by examiner

DAYLIGHTING FOR DIFFERENT GROUPS OF LIGHTING FIXTURES

FIELD OF THE DISCLOSURE

The present disclosure relates to lighting fixtures and controls therefor, and in particular to controlling the light output of a lighting fixture based at least in part on ambient light.

BACKGROUND

In recent years, a movement has gained traction to replace incandescent light bulbs with lighting fixtures that employ more efficient lighting technologies, as well as to replace relatively efficient fluorescent lighting fixtures with lighting technologies that produce a more pleasing, natural light. One such technology that shows tremendous promise employs light emitting diodes (LEDs). Compared with incandescent bulbs, LED-based light fixtures are much more efficient at converting electrical energy into light, are longer lasting, and are also capable of producing light that is very natural. Compared with fluorescent lighting, LED-based fixtures are also very efficient, but are capable of producing light that is much more natural and more capable of accurately rendering colors. As a result, lighting fixtures that employ LED technologies are replacing incandescent and fluorescent bulbs in residential, commercial, and industrial applications.

Unlike incandescent bulbs that operate by subjecting a filament to a desired current, LED-based lighting fixtures require electronics to drive one or more LEDs. The electronics generally include a power supply and special control circuitry to provide uniquely configured signals that are required to drive the one or more LEDs in a desired fashion. The presence of the control circuitry adds a potentially significant level of intelligence to the lighting fixtures that can be leveraged to employ various types of lighting control. Such lighting control may be based on various environmental conditions, such as ambient light, occupancy, temperature, color temperature, and the like. For example, daylighting is a control technique that is used to regulate the light output levels of one or more lighting fixtures based on ambient light levels.

Light in a particular area may come from various sources. For instance, the area may have a group of lighting fixtures as well as supplemental light sources from which supplemental light is received at different levels throughout the day. The supplemental light sources may be natural, artificial, or a combination thereof. Ambient light is considered the combination of the light provided by the group of lighting fixtures and the supplemental light provided by the supplemental light sources.

Daylighting generally refers to the process of dynamically regulating the output level of the light emitted by the lighting fixtures, based on the ambient light level for the area to maintain a desired ambient light level for the area. As the amount of supplemental light increases, the group of lighting fixtures will decrease their light output levels in a proportionate manner to maintain a desired ambient light level. Similarly, as the amount of supplemental light decreases, the group of lighting fixtures will increase their light output levels.

SUMMARY

While the concept of daylighting is relatively straightforward, application of daylighting is often fraught with complexity, especially when two groups of lighting fixtures are provided in the same general area and each group is independently dimmable. For example, if the lighting fixtures of the first group are dimmed to a lower output level, the lighting fixtures of the second group will try to increase their output level to compensate for the reduction in ambient light that is caused by dimming the lighting fixtures in the first group. The reaction by the second group to dimming of the first group is often undesirable. The concepts described herein address this issue.

Assume that the two groups of lighting fixtures are located in the same general area, employ daylighting, and provide light that can be sensed by each other. According to one embodiment, the first group will determine an actual lighting contribution provided by the second group and remove the actual lighting contribution provided by the second group when making daylighting decisions. As such, when the dimming level of the second group is changed, the first group will effectively ignore changes in the dimming level of the second group when making daylighting decisions, and vice versa. A group of lighting fixtures may include one or more lighting fixtures.

In one embodiment, a given lighting fixture is configured as follows. Assume that the lighting fixture may be associated with a first group of lighting fixtures, which is located in the same environment as a second group of lighting fixtures. The lighting fixture may include a light source configured to emit light; an ambient light sensor; and circuitry to control the operation of the lighting fixture and communicate with other lighting fixtures, wall controllers, or the like.

In this embodiment, the circuitry is configured to:
determine a reference output level for light emitted from the first group of lighting fixtures;
determine an actual lighting contribution for light emitted from the second group of lighting fixtures;
reduce the reference output level by the actual lighting contribution to provide an adjusted reference level that is a function of a target level; and
monitor the ambient light sensor and regulate the light output level such that a measurement from the ambient light sensor corresponds to the target level.

The local dimming information that controls the dimming level for the first group of lighting fixtures may be received from a wall controller or another lighting fixture in the first group. The target level may be based on the adjusted reference level and the local dimming level. The local dimming level may correspond to a percentage of a full output level for the light source, and the target level may correspond to the percentage of the full output level multiplied by the adjusted reference level.

In one configuration, the actual lighting contribution of the second group is determined as a group. As such, to determine the actual lighting contribution, the circuitry is further configured to:
determine a potential lighting contribution of the second group of lighting fixtures;
receive dimming information corresponding to the dimming level associated with the second group of lighting fixtures; and
determine the actual lighting contribution based on the potential lighting contribution and the dimming information corresponding to the dimming level associated with the second group of lighting fixtures.

In another configuration, the actual lighting contribution of the second group is determined on a fixture-by-fixture basis. To determine the potential lighting contribution, the circuitry is further configured to:

for each lighting fixture in the second group of lighting fixtures, determine a difference in ambient light levels between the lighting fixture in the second group of lighting fixtures emitting light at a full output level and not emitting light; and sum the differences in the ambient light levels for each lighting fixture in the second group of lighting fixtures to determine the potential lighting contribution.

Determining the potential lighting contribution may include, for each lighting fixture in the second group of lighting fixtures:

instruct the lighting fixtures in the second group of lighting fixtures to emit light at the full output level while other lighting fixtures in the second group of lighting fixtures remain at a set output level;

measure the ambient light level at the full output level when the lighting fixture in the second group of lighting fixtures is emitting light at the full output level;

instruct the lighting fixtures in the second group of lighting fixtures to not emit light while other lighting fixtures in the second group of lighting fixtures remain at a set output level; and measure the ambient light level when the lighting fixture in the second group of lighting fixtures is not emitting light.

To determine the potential lighting contribution, the circuitry may determine a difference in ambient light levels between all of the lighting fixtures in the second group of lighting fixtures emitting light at a full output level and not emitting light, wherein the difference in the ambient light levels corresponds to the potential lighting contribution. When determining the potential lighting contribution, the circuitry may be configured to:

instruct each of the lighting fixtures in the second group of lighting fixtures to emit light at the full output level at the same time;

measure the ambient light level at the full output level when the lighting fixtures in the second group of lighting fixtures are emitting light at the full output level;

instruct each of the lighting fixtures in the second group of lighting fixtures to not emit light at the same time; and measure the ambient light level when the lighting fixtures in the second group of lighting fixtures are not emitting light.

The dimming information for the second group may be received from one or more lighting fixtures of the second group.

To determine the reference output level for light emitted from the first group of lighting fixtures, the circuitry may be configured to:

instruct each lighting fixture in the first group of lighting fixtures to output light at a full output level;

emit light from the light source at the full output level;

measure the ambient light level when the lighting fixtures in the first group of lighting fixtures are emitting light at the full output level;

instruct each lighting fixture in the first group of lighting fixtures to not output light;

stop emitting light from the light source;

measure the ambient light level when the lighting fixtures in the first group of lighting fixtures are not emitting light; and determine a difference between the ambient light level when the lighting fixtures in the first group of lighting fixtures are emitting light at the full output level and the ambient light level when the lighting fixtures in the first group of lighting fixtures are not emitting light, wherein the difference corresponds to the reference output level.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
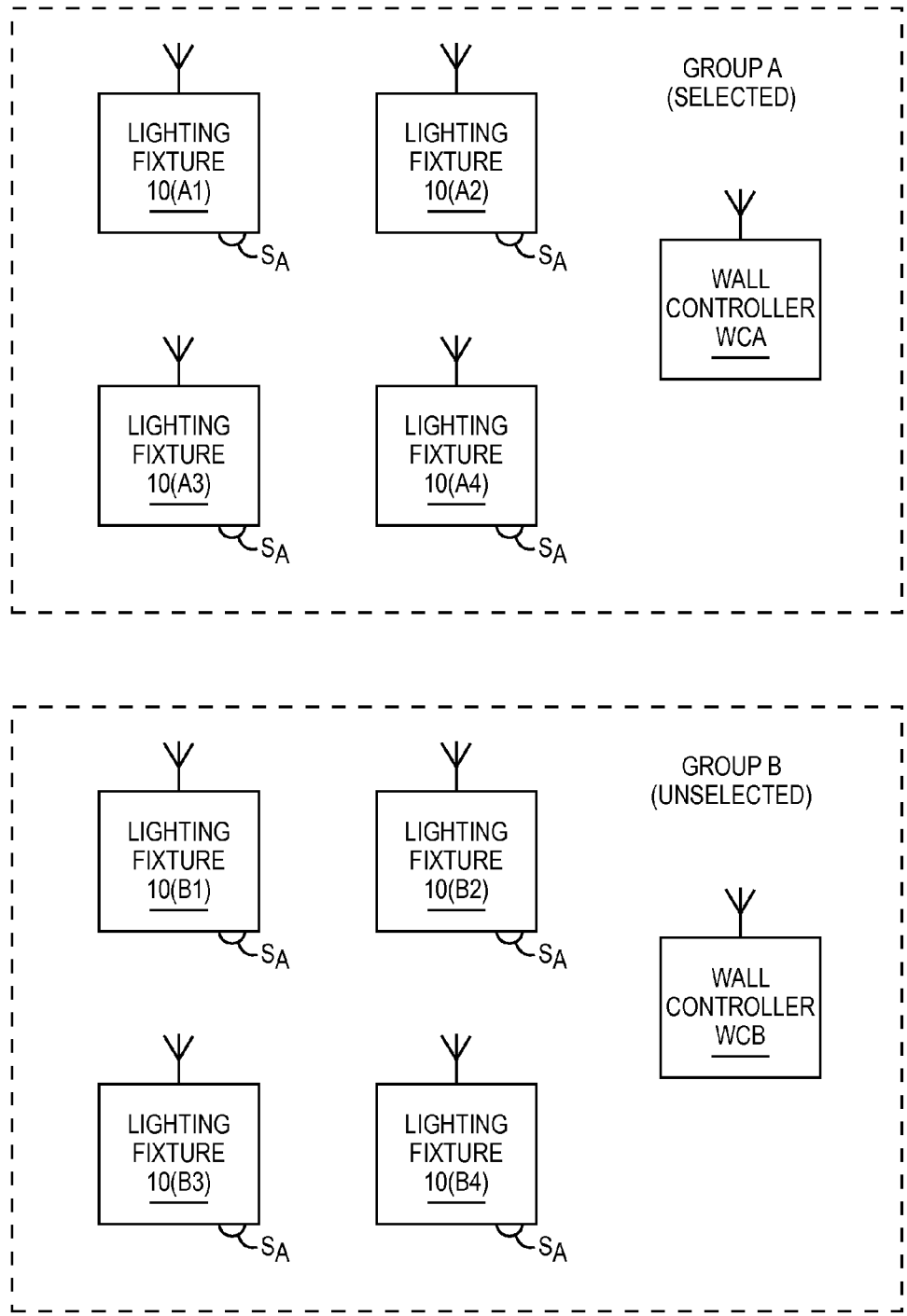
FIG. 1 is a lighting environment according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

Light in a particular area may come from various sources. For example, an area may have one or more lighting fixtures as well as supplemental light sources from which supplemental light is received at different levels throughout the day. The supplemental light sources may be natural or artificial. Ambient light is the term used to describe the combination of the light provided by the lighting fixtures and the supplemental light provided by the supplemental light sources.

Daylighting generally refers to the process of dynamically regulating the output level of the light emitted by the lighting fixtures, based on the ambient light level for the area to maintain a desired ambient light level for the area. As the amount of supplemental light increases, the group of lighting fixtures will decrease their light output levels in a proportionate manner to maintain a desired ambient light level. Similarly, as the amount of supplemental light decreases, the group of lighting fixtures will increase their light output levels.

For example, assume that there is a lighting fixture in a room with a large window through which natural light floods into the room at different levels throughout the day and depending on weather conditions. In the evening, exterior lighting fixtures provide outdoor lighting that passes through the window, and thus contributes to the ambient light in the room in the evening. In an effort to maintain a desired level of light in the room or on a task surface throughout the day and night, the lighting fixture may be configured to sense the ambient light levels in the room and regulate the amount of light that they provide such that the ambient light maintains a desired level. As the amount of natural light in the room increases, the light output of the lighting fixture will decrease, and vice versa. Thus, daylighting conserves energy and helps ensure desired lighting levels. For a group of lighting fixtures, daylighting may be provided on a fixture-by-fixture basis or in uniform manner as a group.

While the concept of daylighting is relatively straightforward, application of daylighting is often fraught with complexity. For example, assume that a room has two groups of lighting fixtures 10, as illustrated in FIG. 1. Group A includes four lighting fixtures 10, which are individually referenced as lighting fixtures A1, A2, A3, and A4, respectively, and a wall controller WCA. The wall controller WCA is configured to turn on, turn off, and set a dimming level or color temperature for the lighting fixtures A1, A2, A3, and A4. Group B includes four lighting fixtures 10, which are individually identified as lighting fixtures B1, B2, B3, and B4, and a wall controller WCB. The wall controller WCB is configured to turn on, turn off, and set a dimming level or color temperature for the lighting fixtures B1, B2, B3, and B4.

Daylighting and dimming are different concepts. Daylighting results in dynamically regulating the light output level of the lighting fixture 10 or a group of lighting fixtures 10 based on a measured amount of ambient light. The light output level may be further adjusted based on a dimming level that is set by a user via a wall controller WC. If the dimming level is set for maximum output (100%), daylighting causes the group of lighting fixtures 10 to reduce their maximum light output levels based on the amount of ambient light that is measured. If no light source other than the group of lighting fixtures 10 is available, the lighting fixtures 10 output light at their maximum light output levels. As light from another source is added to the mix, the daylighting function adjusts the light output levels accordingly.

If the dimming level is set to 60%, daylighting causes the group of lighting fixtures 10 to reduce their light output levels to 60% of what would be output at a 100% dimming level. As such, the lighting fixtures 10 continue to dynamically adjust their output levels based on the amount of ambient light, but output light at 60% of what would be provided if the dimming level were set to maximum output (100%).

When Groups A and B are in the same room and the lighting fixtures 10 within those groups are capable of daylighting, control issues may arise. For example, if the lighting fixtures 10 of Group B are dimmed to a lower output level, the lighting fixtures 10 of Group A will automatically increase their output levels to compensate for the reduction in ambient light that is caused by dimming the lighting fixtures 10 of Group B, and vice versa. Such results are undesirable.

When daylighting, it may be desirable for the lighting fixtures 10 of Group B to effectively ignore the light output of the lighting fixtures 10 of Group A. The concepts described herein provide an elegant solution for this and related issues associated with employing daylighting in lighting groups whose light output may interact with one another. In essence, the concepts disclosed herein allow one group of lighting fixtures to be dimmed without substantially affecting the other group when both groups are daylighting.

With continued reference to FIG. 1, assume that the various lighting fixtures 10 are equipped with wireless communication capabilities, as evidenced by the antenna symbol, and an ambient light sensor SA, which is capable of sensing characteristics of the ambient light, such as output (lumen) level, color, CCT, and/or the like. Further assume that the wall controllers WCA and WCB are also equipped with wireless communication capabilities and configured to control the lighting fixtures 10 of the respective Groups A and B. While the embodiments disclosed illustrate the use of wireless communications, wired communications may be employed.

Daylighting for each of the Groups A and B may be provided as a group or on a fixture-by-fixture basis. For example, the lighting fixtures A1, A2, A3, and A4 may coordinate their light outputs, such that each of the lighting fixtures A1, A2, A3, and A4 provides the same light output at any given time and controls that light output based on the amount of ambient light measured by one or more of the associated ambient light sensors SA and the desired dimming level. Accordingly, the lighting fixtures A1, A2, A3, and A4 act in unison in a coordinated fashion. Alternatively, each of the lighting fixtures A1, A2, A3, and A4 may independently adjust their light output based on the amount of ambient light measured by their own ambient light sensor SA and the desired dimming level.

For the present disclosure, the lighting fixtures 10 of Groups A and B employ enhanced daylighting techniques. Essentially, the daylighting techniques enable at least one lighting fixture 10 of Group A to effectively determine the lighting contributions provided by the lighting fixtures 10 of Group B and remove the lighting contributions of Group B when making daylighting decisions for itself. As such, the lighting fixtures 10 of Group A effectively ignore changes in the dimming level of the lighting fixtures 10 of Group B. For the sake of conciseness, the term "group of lighting fixtures" is used to identify a lighting group that is includes one or more lighting fixtures 10 that may be controlled as a group with a wall controller WCA, WCB, or the like.

Figure 2:
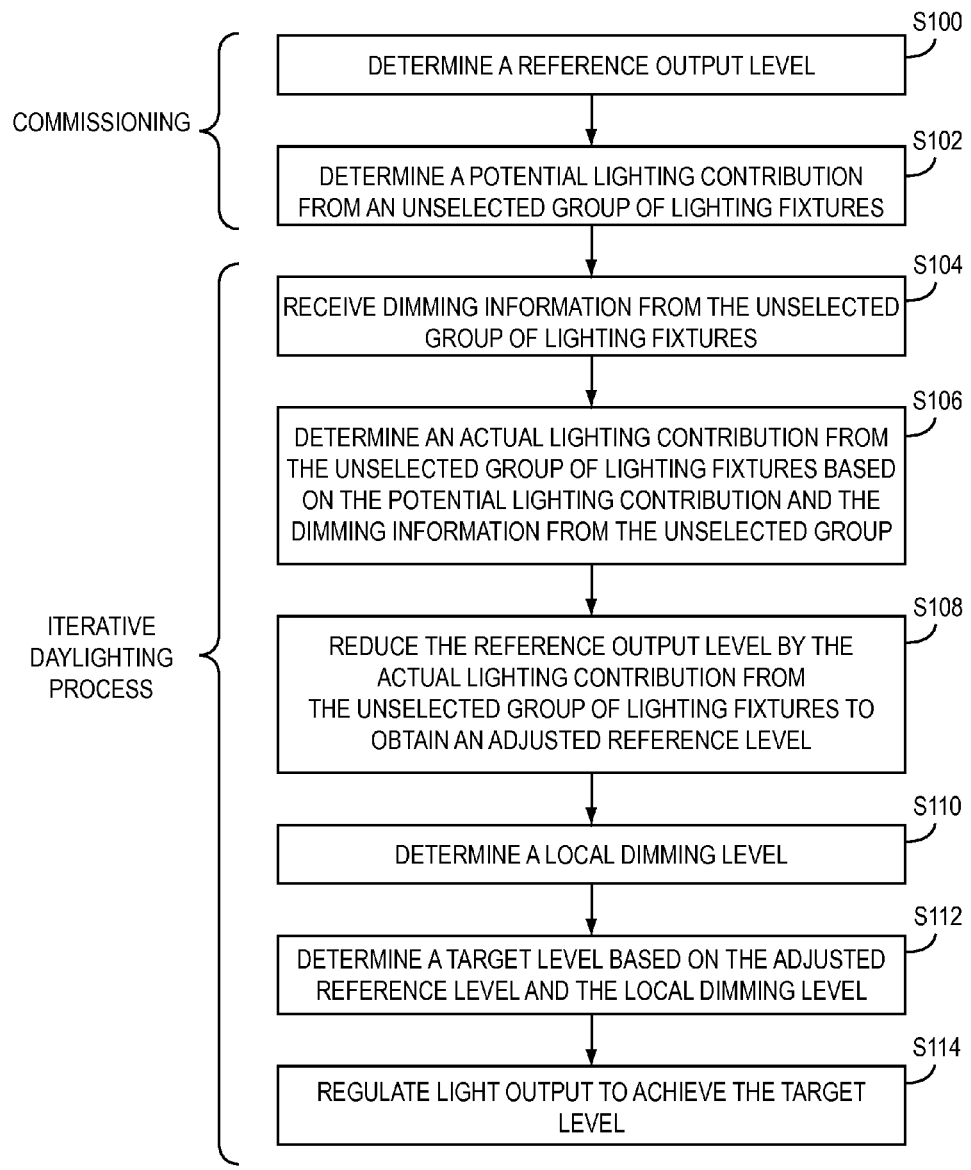
FIG. 2 is a flow diagram illustrating operation of the lighting fixture according to one embodiment of the disclosure.
Figure 3A:
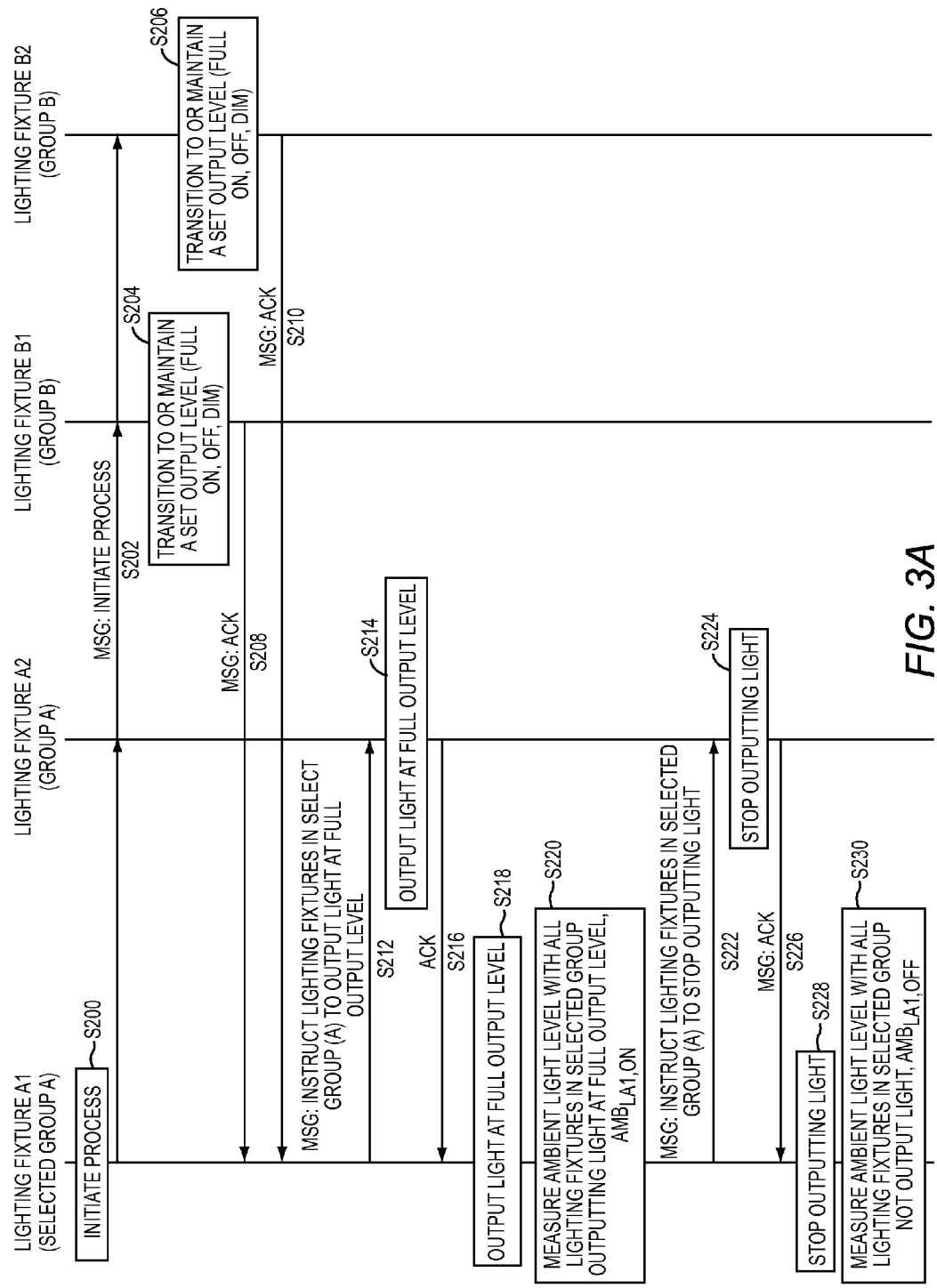
FIGS. 3A through 3D provide a communication flow diagram illustrating the interaction of lighting fixtures according to one embodiment of the disclosure.
Figure 3B:
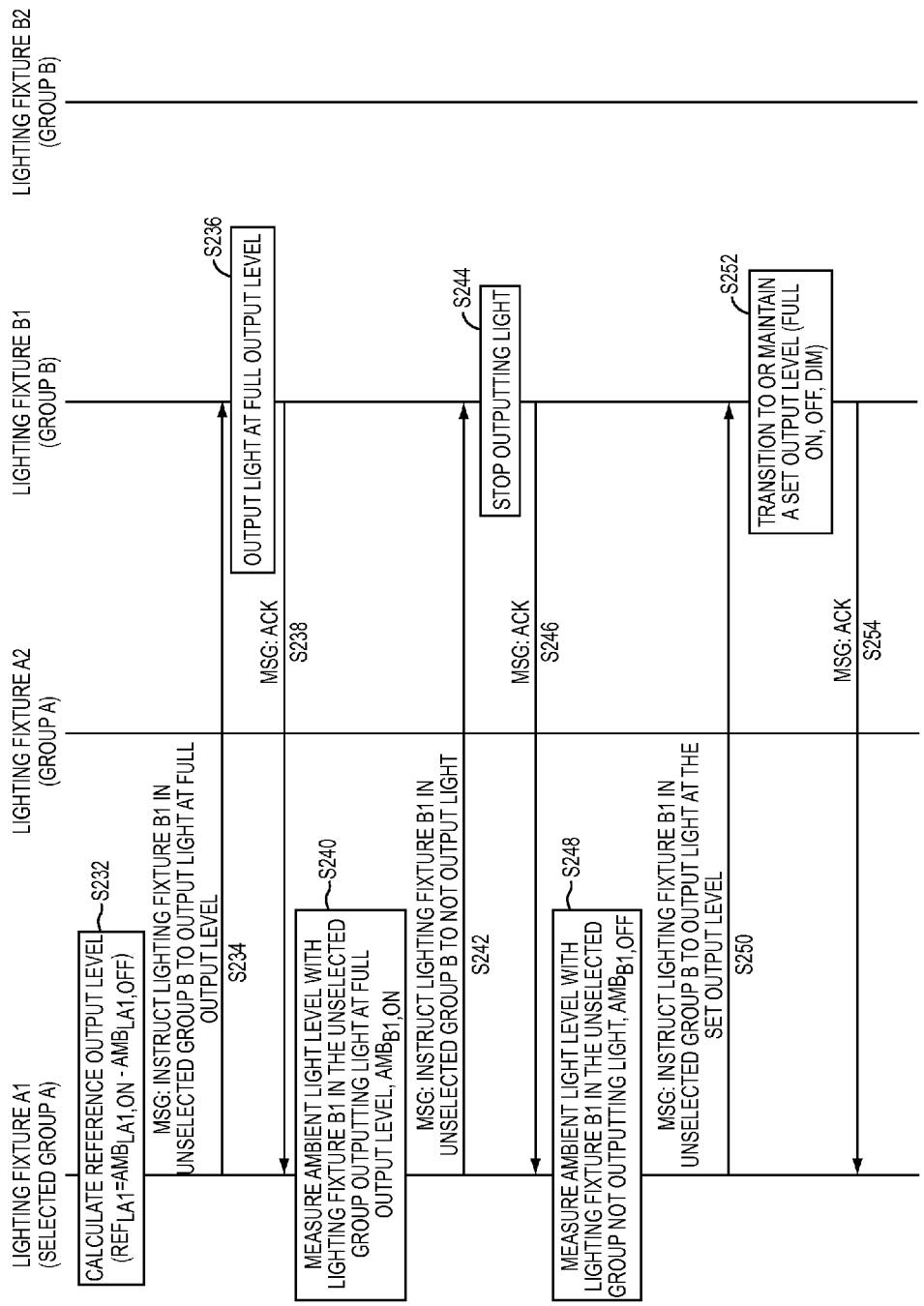
Figure 3C:
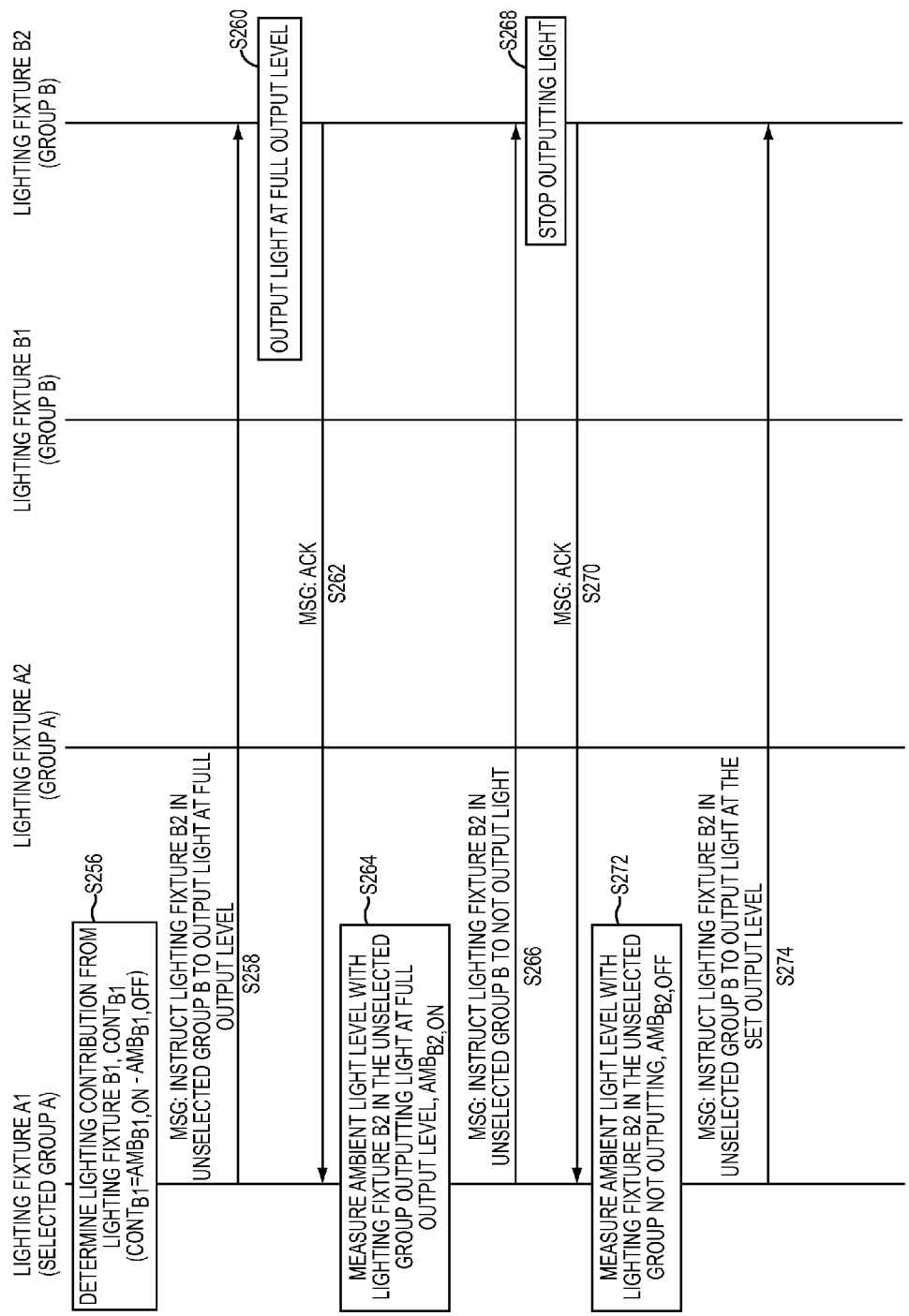
Figure 3D:
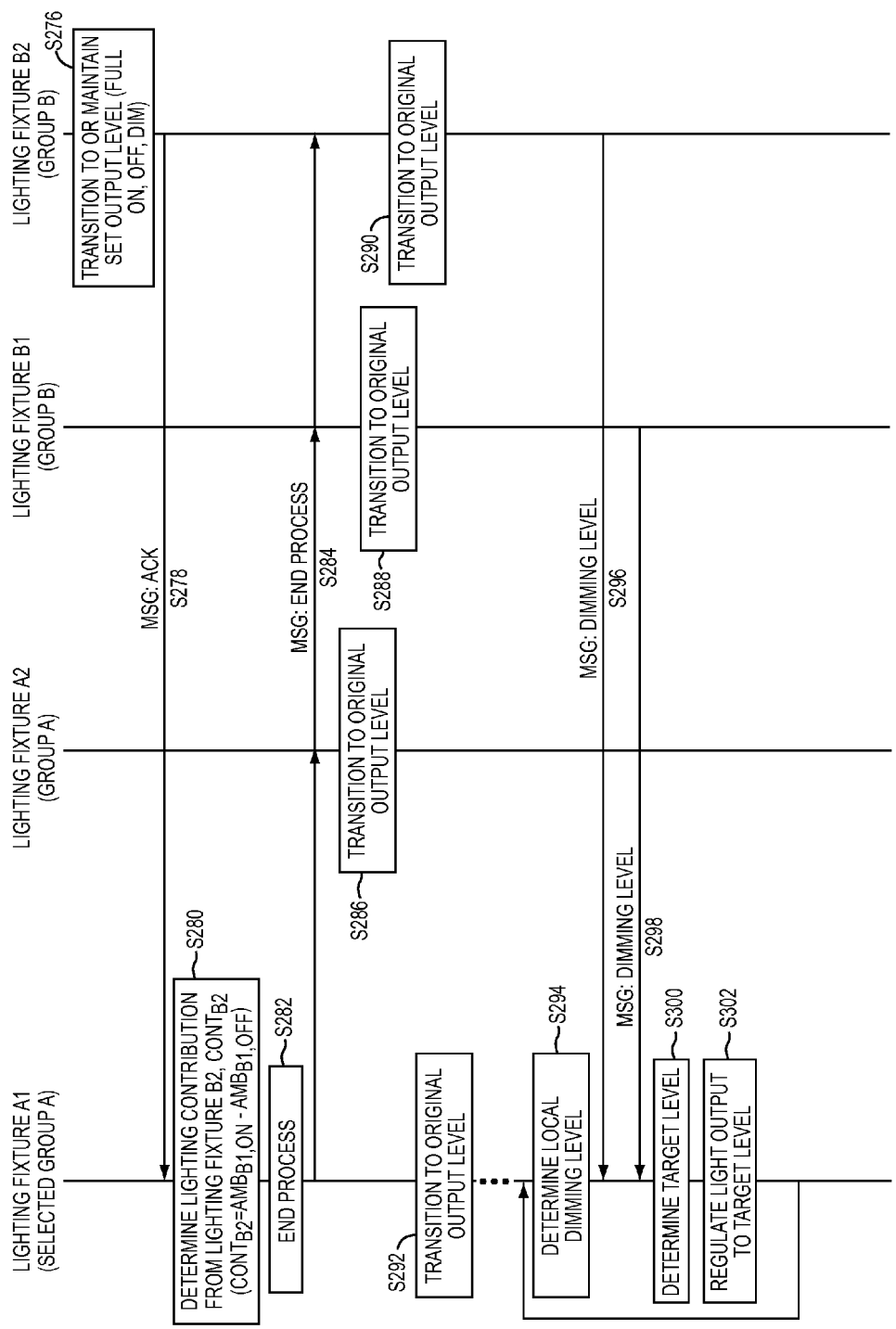

With reference to FIG. 2, a flow diagram for an exemplary embodiment is provided to illustrate the high-level functionality of a lighting fixture 10 that is in a "selected" group of lighting fixtures. Assume that the lighting fixture 10 is lighting fixture A1 of Group A, which is considered the selected group. Group B is considered the "unselected" group of lighting fixtures 10. Lighting fixture A1 effectively determines the lighting contribution provided by the lighting fixtures 10 of the unselected Group B and removes the lighting contribution provided by the unselected Group B from its daylighting decisions. The remaining lighting fixtures A2, A3, and A4 may replicate the same process, depending on whether the lighting fixtures 10 of Group A provide daylighting independently or uniformly as a group.

A one-time commissioning process starts by determining a reference output level for the selected Group A (step S100). The reference output level generally corresponds to an amount of light that is provided by the selected Group A when all of the lighting fixtures A1, A2, A3, and A4 are outputting light at their maximum output levels. To determine the reference output level, lighting fixture A1 will determine the difference between the ambient light level when all of the lighting fixtures A1, A2, A3, and A4 of selected Group A are outputting light at their maximum output levels and the ambient light level when all of the lighting fixtures A1, A2, A3, and A4 of selected Group A are not outputting light.

Next, lighting fixture A1 will determine a potential lighting contribution from the unselected Group B of lighting fixtures B1, B2, B3, and B4 (step S102). The lighting contribution of Group B may be single metric that represents the composite contributions of lighting fixtures B1, B2, B3, and B4, or all of the individual contributions of the lighting fixtures B1, B2, B3, and B4. The details of this step and others are described in detail further below in association with the flow diagram of FIGS. 3A through 3D. At this point, assume that the potential lighting contribution from the unselected Group B of lighting fixtures B1, B2, B3, and B4 corresponds to the amount of light that is provided when the lighting fixtures B1, B2, B3, and B4 are outputting light at their maximum output levels.

Determining the reference output level and the potential lighting contribution from the unselected Group B (Steps S100 and S102) need only occur once during the commissioning process. However, the steps may be provided on a periodic basis, but do not need to be provided on a regular or real-time basis to facilitate the concepts described herein. The reference output level and the potential lighting contribution from the unselected Group B are essentially constant values that will be used during daylighting. The following steps are provided in an iterative manner during daylighting for this embodiment.

During normal operation, lighting fixture A1 receives dimming information from the lighting fixtures B1, B2, B3, and B4 of unselected Group B (step S104). For example, the dimming information may indicate that each of the lighting fixtures B1, B2, B3, and B4 are operating at a 60% dimming level. Lighting fixture A1 next determines an actual lighting contribution from the unselected Group B of the lighting fixtures B1, B2, B3, and B4 based on the potential lighting contribution and the dimming information from the lighting fixtures B1, B2, B3, and B4 of unselected Group B (step S106). For example, the potential lighting contribution is effectively reduced based on the dimming level to determine the actual lighting contribution. If the dimming level is 60%, the actual lighting contribution may correspond to 60% (dimming level) of the potential lighting contribution of the unselected Group B of lighting fixtures B1, B2, B3, and B4.

Lighting fixture A1 then reduces the reference output level by the actual lighting contribution of the unselected Group B of lighting fixtures B1, B2, B3, and B4 to obtain an adjusted reference level (step S108). Next, lighting fixture A1 determines a local dimming level (step S110). In this example, the local dimming level is the dimming level that is provided by the wall controller WCA. A target level is determined based on the adjusted reference level and the local dimming level (step S112). If the local dimming level is 80%, the target level may correspond to 80% of the adjusted reference level.

The target level corresponds to the ambient light level to which lighting fixture A1 should regulate. As such, lighting fixture A1 will monitor its ambient light sensor SA and regulate its light output such that the ambient light level, as sensed by the ambient light sensor SA, corresponds to the target level (step S114).

Lighting fixture A1 will iteratively recalculate the target level and regulate to the target level as provided for in steps S104 through S114. The other lighting fixtures A2, A3, and A4 of the selected Group A may operate in the same manner as lighting fixture A1. As such, the target levels for the selected Group A of lighting fixtures A1, A2, A3, and A4 will change as ambient lighting conditions change; the dimming levels for the selected Group A of lighting fixtures A1, A2, A3, and A4 change; and the dimming levels for unselected Group B of lighting fixtures B1, B2, B3, and B4 change. The end result is that the target level is determined in a manner that causes the actual light output of the selected Group A of lighting fixture A1, A2, A3, and A4 to be effectively independent of the light output of the unselected Group B of lighting fixtures B1, B2, B3, and B4. Group B is configured in the same manner, such that it is not affected by changes in dimming levels for Group A while Group B is daylighting.

Turning now to FIGS. 3A through 3F, a detailed example of determining a reference output level for lighting fixture A1 and the lighting contribution of the unselected Group B is provided for an exemplary embodiment. For simplicity, assume that the selected Group A only includes lighting fixtures A1 and A2 and the unselected Group B only includes lighting fixtures B1 and B2. Otherwise, assume the lighting environment is configured as shown in FIG. 1. This process may be repeated for each of the lighting fixtures 10 in both of Groups A and B.

Initially, lighting fixture A1 initiates the commission process (step S200) and broadcast a message (MSG) to initiate the commissioning process to lighting fixtures, A2, B1, and B2 (step S202). In response, lighting fixtures B1 and B2 transition to or maintain a set output level until instructed otherwise (steps S204 and 206). Lighting fixtures B1 and B2 provide acknowledgment messages (ACK) back to lighting fixture A1 to confirm that they are going to keep their light output levels fixed until instructed otherwise (steps S208 and 210).

Lighting fixture A1 next instructs the other lighting fixtures 10 in its selected Group A to output light at their full output levels (step S212). In this case, the only other lighting fixture in the selected Group A is lighting fixture A2. Upon receiving instruction, lighting fixture A2 outputs light at its full output level (step S214) and provides an acknowledgment message back to lighting fixture A1 (step S216). Lighting fixture A1 also outputs light at its full output level (step S218). At this point, each of the lighting fixtures 10 in the selected Group A is outputting light at its full output level. Using its ambient light sensor SA, lighting fixture A1 measures the ambient light level with all of the lighting fixtures 10 of the selected Group A outputting light at their full output levels (step S220). The ambient light level with all of the lighting fixtures A1 and A2 in the selected group A outputting light at their full output level is referenced as $AMB_{LA1,ON}$.

Next, lighting fixture A1 instructs the lighting fixtures 10 in its selected Group A to turn off, or stop outputting light (step S222). Again, the only other lighting fixture 10 in the selected Group A is lighting fixture A2. Upon the receiving the instruction, lighting fixture A2 stops outputting light (step S224) and provides an acknowledgment message back to lighting fixture A1 (step S226). Lighting fixture A1 also stops outputting light (step S228). At this point, none of the lighting fixtures in the selected Group A are outputting light. Using its ambient light sensor SA, lighting fixture A1 measures the ambient light level with none of the lighting fixtures 10 of the select Group A outputting light (step S230). The ambient light level with none of the lighting fixtures 10 in the selected group A outputting light is referenced as $AMB_{LA1,OFF}$.

Lighting fixture A1 next calculates its reference output level, $REF_{LA1}$ (step S232). The reference output level, $REF_{LA1}$, corresponds to the difference between the ambient light level with all of the lighting fixtures 10 in the selected group A outputting light at their full output level and the ambient light level with none of the lighting fixtures 10 in the selected group A outputting light. For example, $REF_{LA1}=AMB_{LA1,ON}-AMB_{LA1,OFF}$.

The reference output level, $REF_{LA1}$ is calculated with all of the lighting fixtures 10 in the selected Group A turning on and off as a group. To determine the lighting contribution from the unselected Group B as measured by lighting fixture A1, the lighting contribution of the group may be characterized as a whole or on a fixture-by-fixture basis. The following illustrates a fixture-by-fixture approach, which tends to be more accurate. For a group approach, each lighting fixture 10 in the unselected Group B will simply operate in unison and essentially appear as a single lighting fixture from the perspective of the lighting fixtures A1 and the other lighting fixtures 10 in the selected Group A. For the following process, the output levels for the lighting fixtures 10 in the selected Group A should remain at a constant output level, which may be full, off, or at a dimmed level.

Lighting fixture A1 next instructs only lighting fixture B1 in the unselected Group B to output light at the full output level (step S234). Upon receiving the instruction, lighting fixture B1 outputs light at its full output level (step S236) and provides an acknowledgment message back to lighting fixture A1 (step S238). Using its ambient light sensor SA, lighting fixture A1 measures the ambient light level with lighting fixture B1 outputting light at its full output level (step S240). This ambient light level with lighting fixture B1 outputting light at its full output level is referenced as $AMB_{B1,ON}$.

Next, lighting fixture A1 instructs only lighting fixture B1 in the unselected Group B to stop outputting light (step S242). Upon receiving the instruction, lighting fixture B1 stops outputting light (step S244) and provides an acknowledgment message back to lighting fixture A1 (step S246). Using its ambient light sensor SA, lighting fixture A1 measures the ambient light level with lighting fixture B1 not outputting light (step S248). This ambient light level with lighting fixture B1 not outputting light is referenced as $AMB_{B1,OFF}$.

Lighting fixture A1 next instructs only lighting fixture B1 in the unselected Group B to return to outputting light at the set output level (step S250), which is the output level that was set in step S204. Upon receiving the instruction, lighting fixture B1 transitions to outputting light at the set output level (step S252) and provides an acknowledgment message back to lighting fixture A1 (step S254). Lighting fixture A1 then determines the lighting contribution from lighting fixture B1, $CONT_{B1}$, by looking at the difference between the ambient light level when lighting fixture B1 was outputting light at the full output level, $AMB_{B1,ON}$, and the ambient light level when the lighting fixture B1 was not outputting light, $AMB_{B1,ON}$, (step S256). For example, $CONT_{B1}=AMB_{B1,ON}-AMB_{B1,OFF}$.

Once the lighting contribution from lighting fixture B1 is determined, lighting fixture A1 will next determine the lighting contribution from lighting fixture B2. As such, lighting fixture A1 next instructs only lighting fixture B2 in the unselected Group B to output light at the full output level (step S258). Upon receiving the instruction, lighting fixture B2 outputs light at its full output level (step S260) and provides an acknowledgment message back to lighting fixture A1 (step S262). Using its ambient light sensor SA, lighting fixture A1 measures the ambient light level with lighting fixture B2 outputting light at its full output level (step S264). This ambient light level with lighting fixture B2 outputting light at its full output level is referenced as $AMB_{B2,ON}$.

Next, lighting fixture A1 next instructs only lighting fixture B2 in the unselected Group B to stop outputting light (step S266). Upon receiving the instruction, lighting fixture B2 stops outputting light (step S268) and provides an acknowledgment message back to lighting fixture A1 (step S270). Using its ambient light sensor SA, lighting fixture A1 measures the ambient light level with lighting fixture B2 not outputting light (step S272). This ambient light level with lighting fixture B1 not outputting light is referenced as $AMB_{B2,OFF}$.

Lighting fixture A1 next instructs only lighting fixture B2 in the unselected Group B to return to outputting light at the set output level (step S274), which is the output level that was set in step S204. Upon receiving the instruction, lighting fixture B2 transitions to outputting light at the set output level (step S276) and provides an acknowledgment message back to lighting fixture A1 (step S278). Lighting fixture A1 then determines the lighting contribution from lighting fixture B2, $CONT_{B2}$ by looking at the difference between the ambient light level when lighting fixture B2 was outputting light at the full output level, $AMB_{B2,ON}$, and the ambient light level when the lighting fixture B2 was not outputting light, $AMB_{B2,OFF}$, (step S280). For example, $CONT_{B2}=AMB_{B2,ON}-AMB_{B2,OFF}$.

At this point, the commissioning process ends (step S282), and lighting fixture A1 broadcasts a message indicating the same (step S284). In response, each of the other lighting fixtures (A2, B1, and B2) in the selected and unselected Groups A and B transition to their original light output levels, which were in place prior to the process beginning (steps S286, S288, S290). Lighting fixture A1 also transitions to its original light output level (step S292).

At this point, this process repeats for each of the lighting fixtures 10 in the selected Group A. The process is also provided for each of the lighting fixtures 10 in Group B to determine the lighting contribution of Group A relative to Group B. Once all of the various contributions are characterized, daylighting operation may commence as described below.

Continuing with the flow diagram of FIGS. 3A through 3D and from the perspective of lighting fixture A1, lighting fixture A1 will determine its local dimming level, DLLOCAL, which may have been received from wall controller WCA (step S294). Lighting fixture A1 also receives the various dimming levels, DLB1, DLB2, from each of the lighting fixtures 10 (B1 and B2) of the unselected Group B (steps S296 and S298). The dimming levels from lighting fixtures B1 and B2 may be provided to lighting fixture A1, as well as the other lighting fixtures 10 in the selected Group A, on a periodic basis, when changed, or the like.

At this point, lighting fixture A1 determines the target level to which the light output is regulated (step S300). In one embodiment, the target level, TL, is determined as follows $TL = DL_{LOCAL}(REF_{LA1} - (CONT_{B1} \times DL_{B1} + CONT_{B1} \times DL_{B1} + \ldots CONT_{BN} \times DL_{BN})$. Lighting fixture A1 will monitor the ambient light sensor SA and regulate its light output level such that the measurement from the ambient light sensor SA corresponds to the target level (step S302).

While lighting fixture A1 is functioning in this manner, the other lighting fixtures 10 in Group A are functioning in the same manner with respect to Group B. Similarly, each of the lighting fixtures 10 in Group B is functioning in this manner with respect to Group A. As such, the lighting fixtures 10 of the respective Groups A and B are effectively decoupled from one another with respect to each other's influence. Dimming in one group should not affect the light output of the other group.

As indicated above and defined herein, a "group of lighting fixtures" 10 may include one or more lighting fixtures 10. Each lighting fixture 10 within a particular group may be configured to provide daylighting individually while dimming as a group. Alternatively, each lighting fixture 10 within a particular group may daylight and dim as a group. As such, the ambient lighting contribution of the lighting fixtures 10 in another group, as a whole, or individually, may be handled in a unified manner, wherein one lighting fixture 10 determines the target level and instructs the other lighting fixtures 10 to output light at a certain output level. The controlling light fixture 10 can also share the target level with the other lighting fixtures 10 within the group wherein the lighting fixtures calculate their output level based on the target level. Those skilled in the art will recognize various ways to implement the concepts disclosed above.

Figure 4:
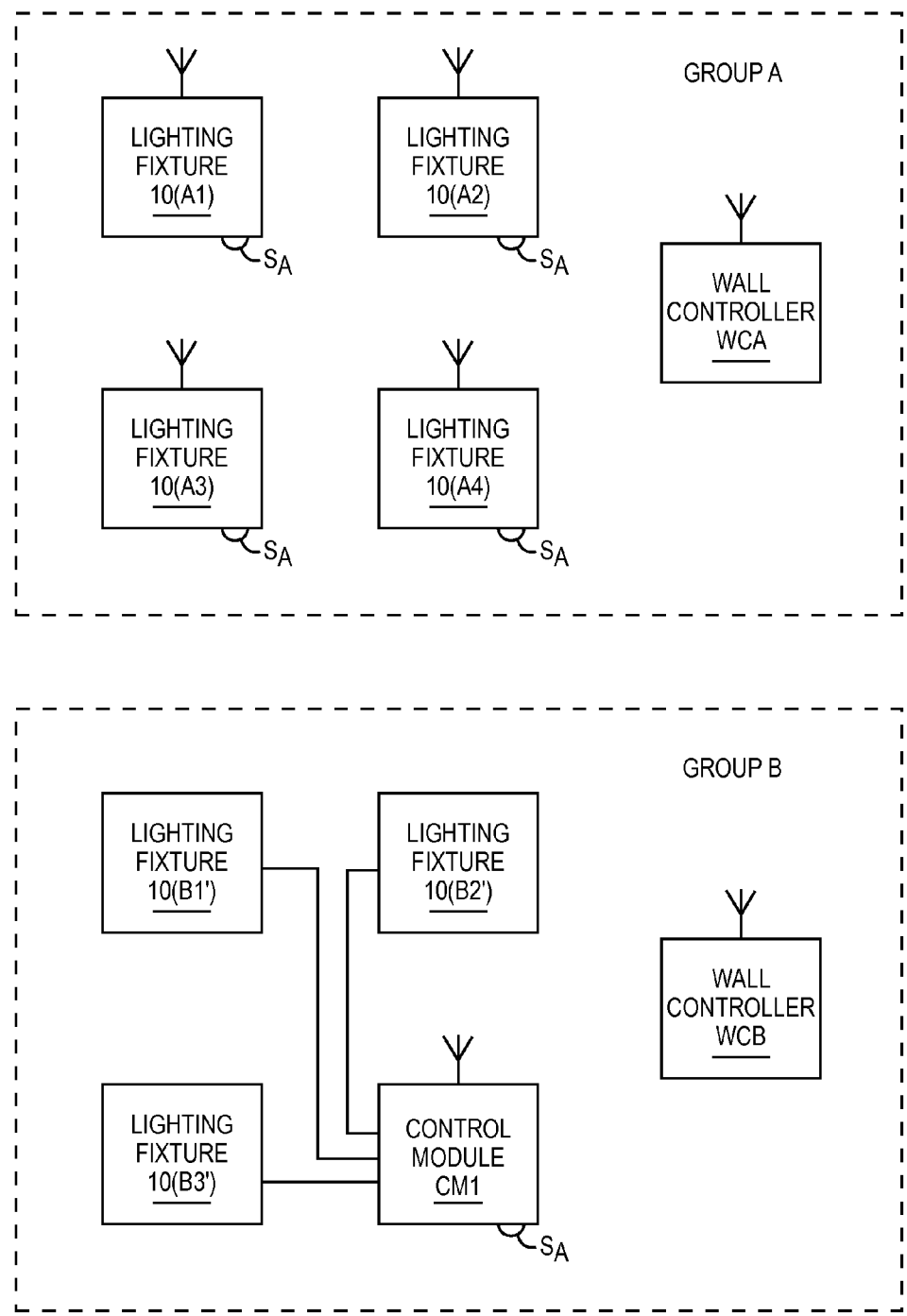
FIG. 4 is a lighting environment according to a second embodiment of the disclosure.

With reference to FIG. 4, an alternative configuration is illustrated wherein each of the lighting fixtures B1', B2', and B3' in Group B are controlled by a control module CM1. Accordingly, the control module CM1 will essentially function in the same manner as lighting fixture A1, as described above. The primary difference is that the control module CM1 does not have an integrated light source and will control the light output levels of lighting fixtures B1', B2', and B3' as described above. The lighting fixtures B1', B2', B3', and B4', may but need not have driver or control electronics for their light sources. The control module CM1 may simply provide control to a lighting fixture 10 that includes electronics to drive its light source. If the lighting fixture 10 only includes the light source, the control module CM1 may also provide the drive signals for the light source.

The prior discussion relates to decoupling associated groups of lighting fixtures with respect light output levels. The disclosed concepts may be extended to spectral content. The spectral content from each lighting fixture 10, or group thereof, can be resolved in the same way that as light output levels. By measuring the spectral content when a lighting fixture 10 is turned on and when the lighting fixture 10 is turned off, the spectral contribution of that lighting fixture 10 may be quantified and effectively ignored by the other lighting fixtures 10, or groups thereof. As such, when one group of lighting fixtures 10 changes its color or correlated color temperature (CCT), the other group can effectively ignore those changes. The processes and functionality described above apply wherein the spectral content, such as, color, CCT, or the like is measured and applied instead of overall light output (lumen level). Further, a combination of these approaches is also possible.

An exemplary lighting fixture in which the concepts described above may be implemented is now described. While the concepts of the present disclosure may be employed in any type of lighting system, the immediately following description describes these concepts in a troffer-type lighting fixture, such as the lighting fixture 10 illustrated in FIGS. 5 through 7. This particular lighting fixture is substantially similar to the CR and CS series of troffer-type lighting fixtures that are manufactured by Cree, Inc. of Durham, N.C.

While the disclosed lighting fixture 10 employs an indirect lighting configuration wherein light is initially emitted upward from a light source and then reflected downward, direct lighting configurations may also take advantage of the concepts of the present disclosure. In addition to troffer-type lighting fixtures, the concepts of the present disclosure may also be employed in recessed lighting configurations, wall mount lighting configurations, outdoor lighting configurations, and the like. Reference is made to co-assigned U.S. patent application Ser. No. 13/589,899 filed Aug. 20, 2013, Ser. No. 13/649,531 filed Oct. 11, 2012, and U.S. Pat. No. 8,829,800, the contents of which are incorporated herein by reference in their entireties. Further, the functionality and control techniques described below may be used to control different types of lighting fixtures, as well as different groups of the same or different types of lighting fixtures at the same time.

Figure 5:
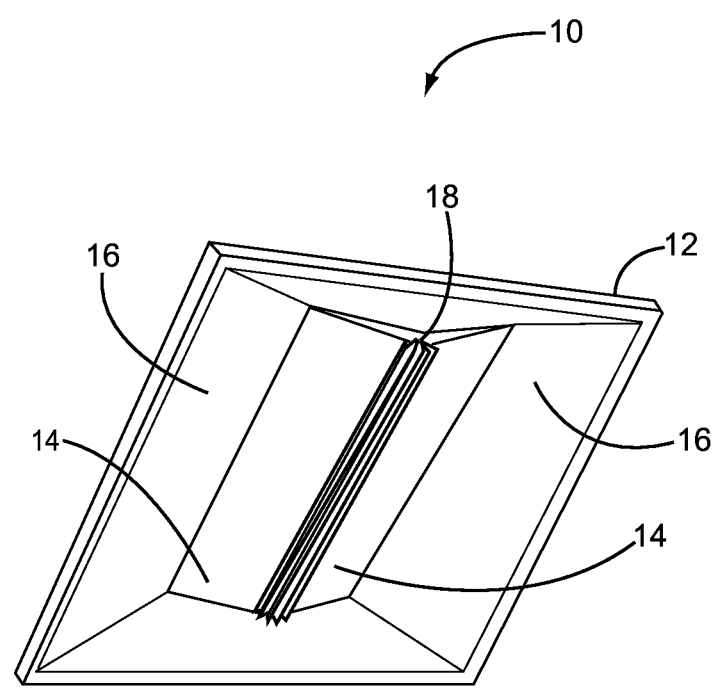
FIG. 5 is a perspective view of a troffer-based lighting fixture according to one embodiment of the disclosure.
Figure 6:
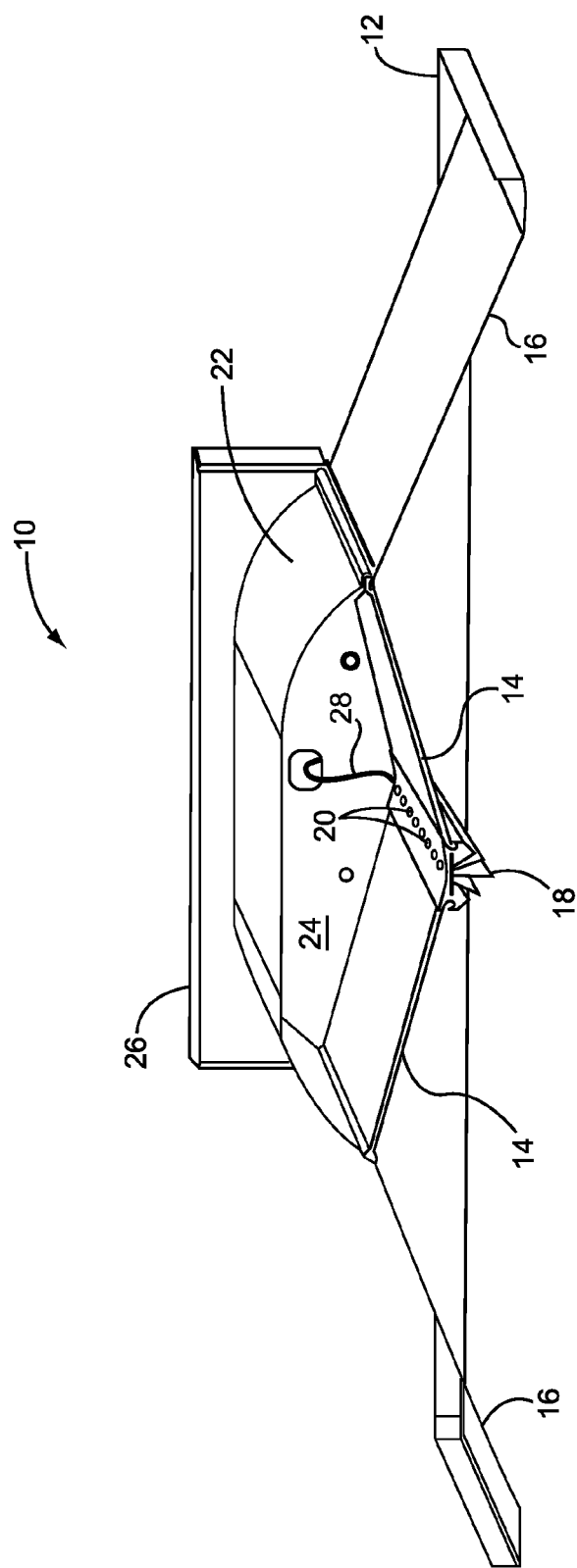
FIG. 6 is a cross section of the lighting fixture of FIG. 5.
Figure 7:
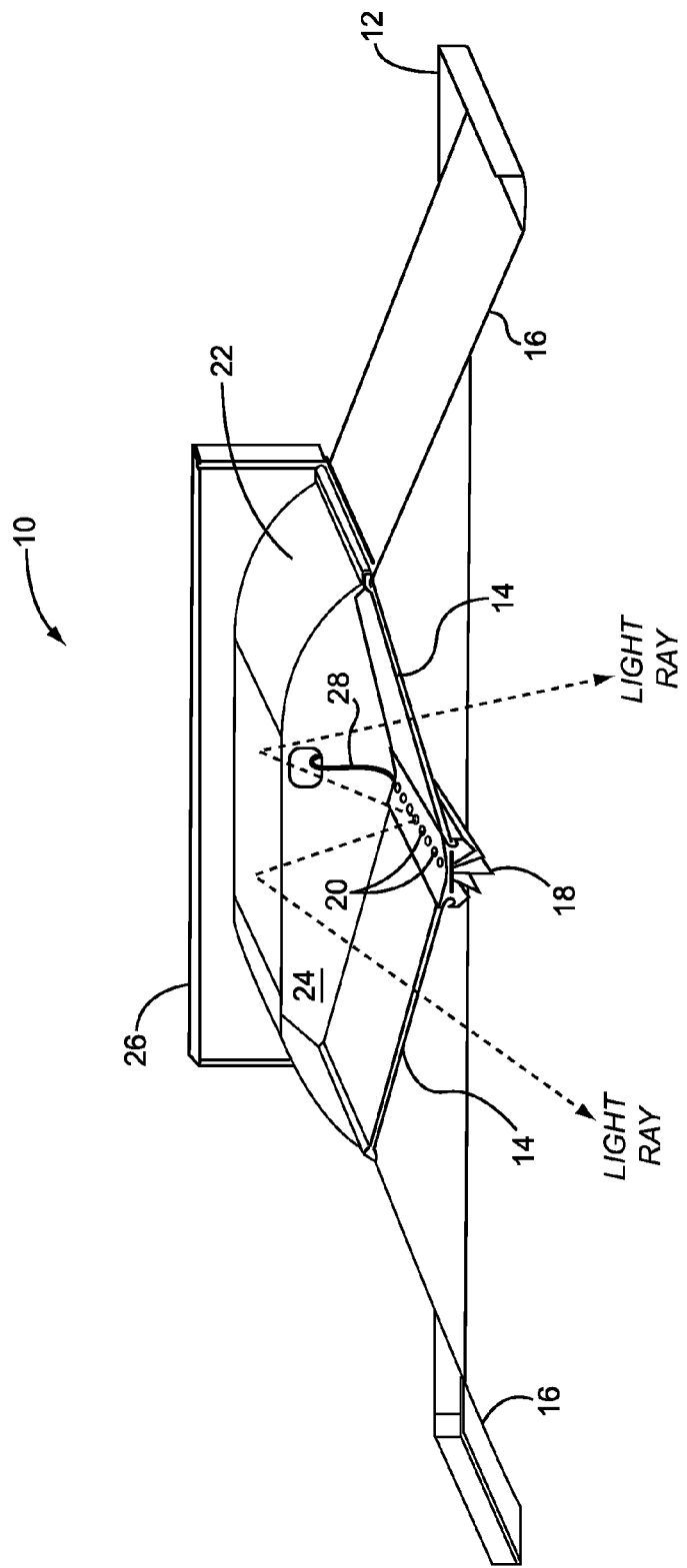
FIG. 7 is a cross section of the lighting fixture of FIG. 5 illustrating how light emanates from the LEDs of the lighting fixture and is reflected out through lenses of the lighting fixture.

In general, troffer-type lighting fixtures, such as the lighting fixture 10, are designed to mount in, on, or from a ceiling. In most applications, the troffer-type lighting fixtures are mounted into a drop ceiling (not shown) of a commercial, educational, or governmental facility. As illustrated in FIGS. 5 through 7, the lighting fixture 10 includes a square or rectangular outer frame 12. In the central portion of the lighting fixture 10 are two rectangular lenses 14, which are generally transparent, translucent, or opaque. Reflectors 16 extend from the outer frame 12 to the outer edges of the lenses 14. The lenses 14 effectively extend between the innermost portions of the reflectors 16 to an elongated heatsink 18, which functions to join the two inside edges of the lenses 14.

Turning now to FIGS. 6 and 7 in particular, the back side of the heatsink 18 provides a mounting structure for an LED array 20, which includes one or more rows of individual LEDs mounted on an appropriate substrate. The LEDs are oriented to primarily emit light upwards toward a concave cover 22. The volume bounded by the cover 22, the lenses 14, and the back of the heatsink 18 provides a mixing chamber 24. As such, light will emanate upwards from the LEDs of the LED array 20 toward the cover 22 and will be reflected downward through the respective lenses 14, as illustrated in FIG. 7. Notably, not all light rays emitted from the LEDs will reflect directly off of the bottom of the cover 22 and back through a particular lens 14 with a single reflection. Many of the light rays will bounce around within the mixing chamber 24 and effectively mix with other light rays, such that a desirably uniform light is emitted through the respective lenses 14.

Those skilled in the art will recognize that the type of lenses 14, the type of LEDs, the shape of the cover 22, and any coating on the bottom side of the cover 22, among many other variables, will affect the quantity and quality of light emitted by the lighting fixture 10. As will be discussed in greater detail below, the LED array 20 may include LEDs of different colors, wherein the light emitted from the various LEDs mixes together to form a white light having a desired color temperature and quality based on the design parameters for the particular embodiment.

As is apparent from FIGS. 6 and 7, the elongated fins of the heatsink 18 may be visible from the bottom of the lighting fixture 10. Placing the LEDs of the LED array 20 in thermal contact along the upper side of the heatsink 18 allows any heat generated by the LEDs to be effectively transferred to the elongated fins on the bottom side of the heatsink 18 for dissipation within the room in which the lighting fixture 10 is mounted. Again, the particular configuration of the lighting fixture 10 illustrated in FIGS. 5 through 7 is merely one of the virtually limitless configurations for lighting fixtures 10 in which the concepts of the present disclosure are applicable.

Figure 8:
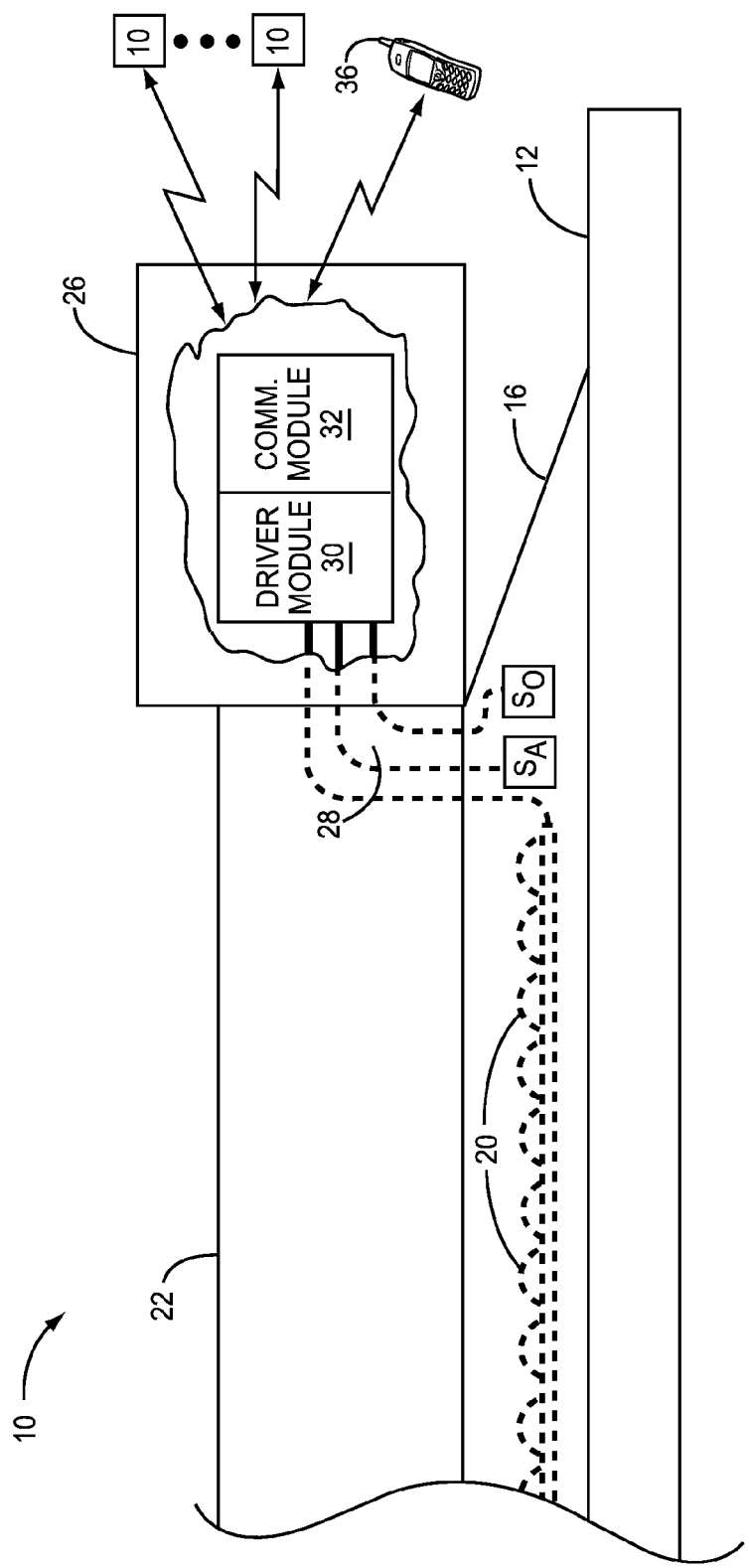
FIG. 8 illustrates a driver module and a communications module integrated within an electronics housing of the lighting fixture of FIG. 1.

With continued reference to FIGS. 6 and 7, an electronics housing 26 is shown mounted at one end of the lighting fixture 10, and is used to house all or a portion of the electronics used to power and control the LED array 20. These electronics are coupled to the LED array 20 through appropriate cabling 28. With reference to FIG. 8, the electronics provided in the electronics housing 26 may be divided into a driver module 30 and a communications module 32.

At a high level, the driver module 30 is coupled to the LED array 20 through the cabling 28 and directly drives the LEDs of the LED array 20 based on control information provided by the communications module 32. In one embodiment, the driver module 30 provides the primary intelligence for the lighting fixture 10 and is capable of driving the LEDs of the LED array 20 in a desired fashion. The driver module 30 may be provided on a single, integrated module or divided into two or more sub-modules depending the desires of the designer.

When the driver module provides the primary intelligence for the lighting fixture 10, the communications module 32 acts as an intelligent communication interface that facilitates communications between the driver module 30 and other lighting fixtures 10, a remote control system (not shown), or a portable handheld commissioning tool 36, which may also be configured to communicate with a remote control system in a wired or wireless fashion.

Alternatively, the driver module 30 may be primarily configured to drive the LEDs of the LED array 20 based on instructions from the communications module 32. In such an embodiment, the primary intelligence of the lighting fixture 10 is provided in the communications module 32, which effectively becomes an overall control module with wired or wireless communication capability, for the lighting fixture 10. The lighting fixture 10 may share sensor data, instructions, and any other data with other lighting fixtures 10 in the lighting network or with remote entities. In essence, the communications module 32 facilitates the sharing of intelligence and data among the lighting fixtures 10 and other entities.

In the embodiment of FIG. 8, the communications module 32 may be implemented on a separate printed circuit board (PCB) than the driver module 30. The respective PCBs of the driver module 30 and the communications module 32 may be configured to allow the connector of the communications module 32 to plug into the connector of the driver module 30, wherein the communications module 32 is mechanically mounted, or affixed, to the driver module 30 once the connector of the communications module 32 is plugged into the mating connector of the driver module 30.

In other embodiments, a cable may be used to connect the respective connectors of the driver module 30 and the communications module 32, other attachment mechanisms may be used to physically couple the communications module 32 to the driver module 30, or the driver module 30 and the communications module 32 may be separately affixed to the inside of the electronics housing 26. In such embodiments, the interior of the electronics housing 26 is sized appropriately to accommodate both the driver module 30 and the communications module 32. In many instances, the electronics housing 26 provides a plenum rated enclosure for both the driver module 30 and the communications module 32.

In this embodiment, the lighting fixture 10 may include one or more sensors, such as occupancy sensors $S_O$, ambient light sensors $S_A$, temperature sensors, sound sensors (microphones), image (still or video) sensors, and the like. If multiple sensors are provided, they may be used to sense the same or different environmental conditions. If multiple sensors are used to sense the same environmental conditions, different types of sensors may be used. Similarly, a single sensor may be used to sense different environmental conditions. For example, an image sensor may be use for both ambient light sensing as well as occupancy sensing.

Figure 9:
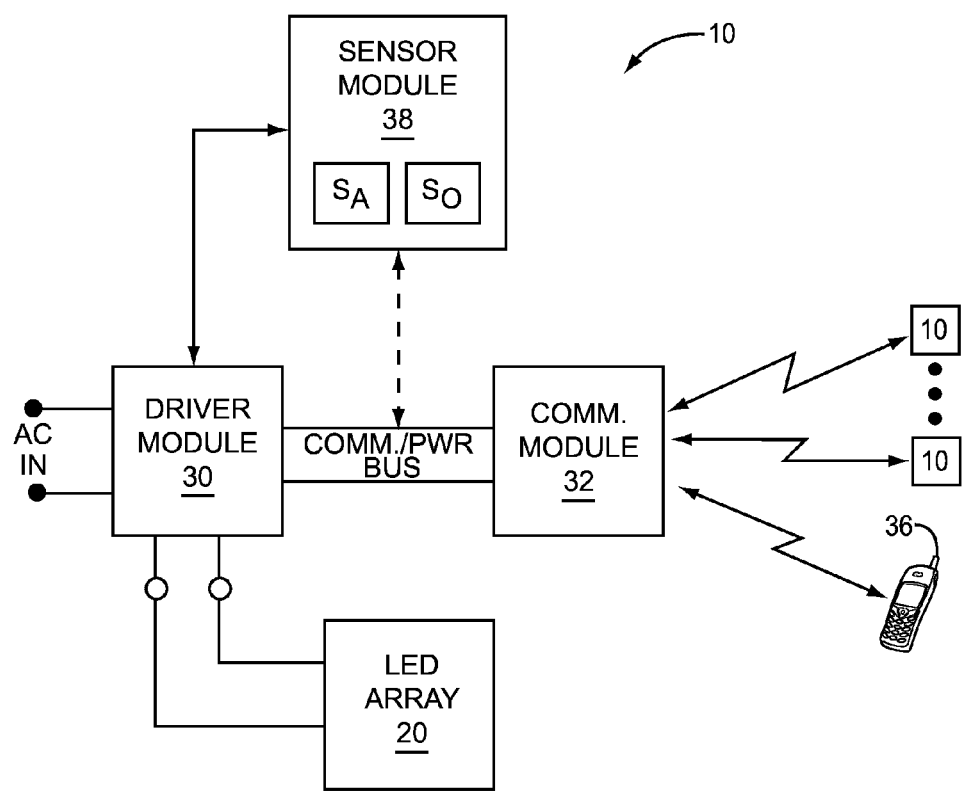
FIG. 9 is a block diagram of a lighting system according to one embodiment of the disclosure.

Turning now to FIG. 9, an electrical block diagram of a lighting fixture 10 is provided according to one embodiment. Assume for purposes of discussion that the driver module 30, communications module 32, and LED array 20 are ultimately connected to form the core electronics of the lighting fixture 10, and that the communications module 32 is configured to bidirectionally communicate with other lighting fixtures 10, the commissioning tool 36, or other control entity through wired or wireless techniques. The ambient light sensor $S_A$ and the occupancy sensor $S_O$ may be incorporated into a sensor module 38.

In this embodiment, a standard communication interface and a first, or standard, protocol are used between the driver module 30 and the communications module 32. This standard protocol allows different driver modules 30 to communicate with and be controlled by different communications modules 32, assuming that both the driver module 30 and the communications module 32 are operating according to the standard protocol used by the standard communication interface. The term "standard protocol" is defined to mean any type of known or future developed, proprietary, or industry-standardized protocol.

In the illustrated embodiment, the driver module 30 and the communications module 32 are coupled via communication and power buses, which may be separate or integrated with one another. The communication bus allows the communications module 32 to receive information from the driver module 30 as well as control the driver module 30. An exemplary communication bus is the well-known inter-integrated circuitry (I²C) bus, which is a serial bus and is typically implemented with a two-wire interface employing data and clock lines. Other available buses include: serial peripheral interface (SPI) bus, Dallas Semiconductor Corporation's 1-Wire serial bus, universal serial bus (USB), RS-232, Microchip Technology Incorporated's UNI/O®, and the like.

In this embodiment, the driver module 30 is configured to collect data from the ambient light sensor $S_A$ and the occupancy sensor $S_O$ of the sensor module 38 and drive the LEDs of the LED array 20. The data collected from the ambient light sensor $S_A$ and the occupancy sensor $S_O$ as well as any other operational parameters of the driver module 30 may be shared with the communications module 32. As such, the communications module 32 may collect data about the configuration or operation of the driver module 30 and any information made available to the driver module 30 by the LED array 20, the ambient light sensor $S_A$, and the occupancy sensor $S_O$. The collected data may be used by the communications module 32 to control how the driver module 30 operates, may be shared with other lighting fixtures 10 or control entities, or may be processed to generate instructions that are sent to other lighting fixtures 10. Notably, the sensor module 38 may be coupled to the communications bus instead of directly to the driver module 30, such that sensor information from the sensor module 38 may be provided to the driver module 30 or the communications module 32 via the communications bus.

The communications module 32 may also be controlled in whole or in part by a remote control entity, such as the commissioning tool 36 or another lighting fixture 10. In general, the communications module 32 will process sensor data and instructions provided by the other lighting fixtures 10 or remote control entities and then provide instructions over the communication bus to the driver module 30. An alternative way of looking at it is that the communications module 32 facilitates the sharing of the system's information, including occupancy sensing, ambient light sensing, dimmer switch settings, etc., and provides this information to the driver module 30, which then uses its own internal logic to determine what action(s) to take. The driver module 30 will respond by controlling the drive current or voltages provided to the LED array 20 as appropriate.

In certain embodiments, the driver module 30 includes sufficient electronics to process an alternating current (AC) input signal (AC IN) and provide an appropriate rectified or direct current (DC) signal sufficient to power the communications module 32, and perhaps the LED array 20. As such, the communications module 32 does not require separate AC-to-DC conversion circuitry to power the electronics residing therein, and can simply receive DC power from the driver module 30 over the power bus. Similarly, the sensor module 38 may receive power directly from the driver module 30 or via the power bus, which is powered by the driver module 30 or other source. The sensor module 38 may also be coupled to a power source (not shown) independently of the driver and communications modules 30, 32.

In one embodiment, one aspect of the standard communication interface is the definition of a standard power delivery system. For example, the power bus may be set to a low voltage level, such as 5 volts, 12 volts, 24 volts, or the like. The driver module 30 is configured to process the AC input signal to provide the defined low voltage level and provide that voltage over the power bus, thus the communications module 32 or auxiliary devices, such as the sensor module 38, may be designed in anticipation of the desired low voltage level being provided over the power bus by the driver module 30 without concern for connecting to or processing an AC signal to a DC power signal for powering the electronics of the communications module 32 or the sensor module 38.

Notably, the control module CM1 of FIG. 4 may be configured to have both a communication module 32 and a driver module 30, which is configured to drive multiple lighting fixtures that essentially only have light sources, such as the LED arrays 20. Alternatively, the lighting fixtures 10 may have driver modules 30 and light sources, and the control module CM1 may have a communication module 32 and control one or more of the lighting fixtures 10 as a group.

Figure 10:
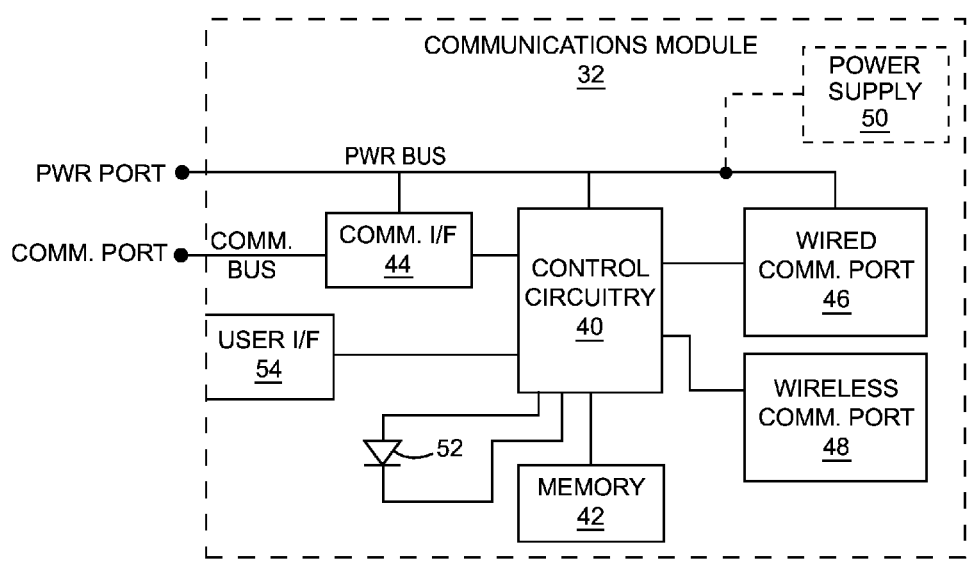
FIG. 10 is a block diagram of a communications module according to one embodiment of the disclosure.

With reference to FIG. 10, a block diagram of one embodiment of the communications module 32 is illustrated. The communications module 32 includes control circuitry 40 and associated memory 42, which contains the requisite software instructions and data to facilitate operation as described herein. The control circuitry 40 may be associated with a communication interface 44, which is to be coupled to the driver module 30, directly or indirectly via the communication bus. The control circuitry 40 may be associated with a wired communication port 46, a wireless communication port 48, or both, to facilitate wired or wireless communications with other lighting fixtures 10, the commissioning tool 36, and remote control entities. The wireless communication port 48 may include the requisite transceiver electronics to facilitate wireless communications with remote entities. The wired communication port 46 may support universal serial (USB), Ethernet, or like interfaces.

The capabilities of the communications module 32 may vary greatly from one embodiment to another. For example, the communications module 32 may act as a simple bridge between the driver module 30 and the other lighting fixtures 10 or remote control entities. In such an embodiment, the control circuitry 40 will primarily pass data and instructions received from the other lighting fixtures 10 or remote control entities to the driver module 30, and vice versa. The control circuitry 40 may translate the instructions as necessary based on the protocols being used to facilitate communications between the driver module 30 and the communications module 32 as well as between the communications module 32 and the remote control entities.

In other embodiments, the control circuitry 40 plays an important role in coordinating intelligence and sharing data among the lighting fixtures 10 as well as providing significant, if not complete, control of the driver module 30. While the communications module 32 may be able to control the driver module 30 by itself, the control circuitry 40 may also be configured to receive data and instructions from the other lighting fixtures 10 or remote control entities and use this information to control the driver module 30. The communications module 32 may also provide instructions to other lighting fixtures 10 and remote control entities based on the sensor data from the associated driver module 30 as well as the sensor data and instructions received from the other lighting fixtures 10 and remote control entities.

Power for the control circuitry 40, memory 42, the communication interface 44, and the wired and/or wireless communication ports 46 and 48 may be provided over the power bus via the power port. As noted above, the power bus may receive its power from the driver module 30, which generates the DC power signal. As such, the communications module 32 may not need to be connected to AC power or include rectifier and conversion circuitry. The power port and the communication port may be separate or may be integrated with the standard communication interface. The power port and communication port are shown separately for clarity. In one embodiment, the communication bus is a 2-wire serial bus, wherein the connector or cabling configuration may be configured such that the communication bus and the power bus are provided using four wires: data, clock, power, and ground. In alternative embodiments, an internal power supply 50, which is associated with AC power or a battery is used to supply power.

The communications module 32 may have a status indicator, such as an LED 52 to indicate the operating state of the communication module. Further, a user interface 54 may be provided to allow a user to manually interact with the communications module 32. The user interface 54 may include an input mechanism, an output mechanism, or both. The input mechanism may include one or more of buttons, keys, keypads, touchscreens, or the like. The output mechanism may include one more LEDs, a display, or the like. For the purposes of this application, a button is defined to include a push button switch, all or part of a toggle switch, rotary dial, slider, or any other mechanical input mechanism.

Figure 11:
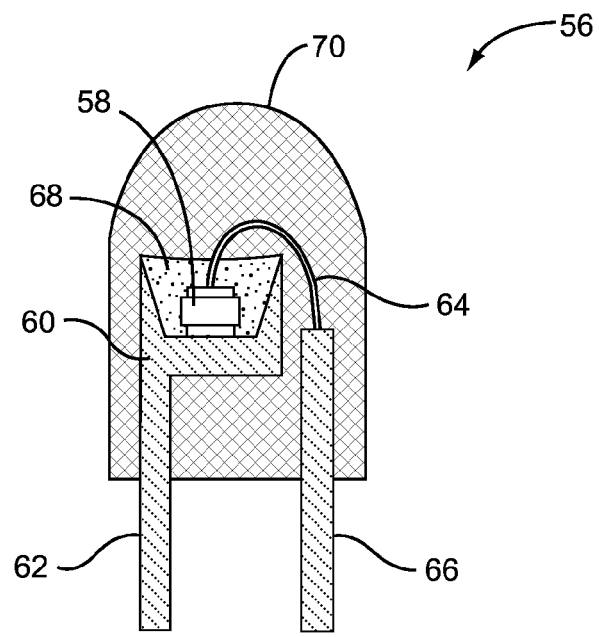
FIG. 11 is a cross section of an exemplary LED according to a first embodiment of the disclosure.

A description of an exemplary embodiment of the LED array 20 and driver module 30 follows. As noted, the LED array 20 includes a plurality of LEDs, such as the LEDs 56 illustrated in FIGS. 11 and 12. With reference to FIG. 11, a single LED chip 58 is mounted on a reflective cup 60 using solder or a conductive epoxy, such that ohmic contacts for the cathode (or anode) of the LED chip 58 are electrically coupled to the bottom of the reflective cup 60. The reflective cup 60 is either coupled to or integrally formed with a first lead 62 of the LED 56. One or more bond wires 64 connect ohmic contacts for the anode (or cathode) of the LED chip 58 to a second lead 66.

The reflective cup 60 may be filled with an encapsulant material 68 that encapsulates the LED chip 58. The encapsulant material 68 may be clear or contain a wavelength conversion material, such as a phosphor, which is described in greater detail below. The entire assembly is encapsulated in a clear protective resin 70, which may be molded in the shape of a lens to control the light emitted from the LED chip 58.

Figure 12:
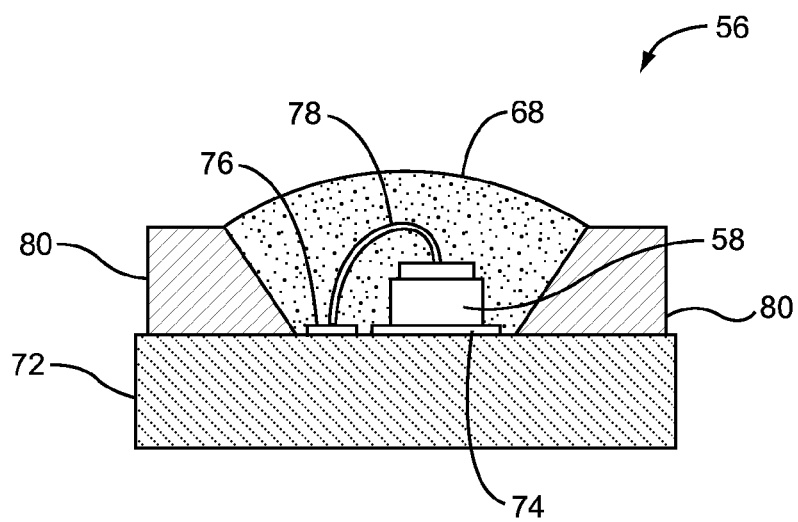
FIG. 12 is a cross section of an exemplary LED according to a second embodiment of the disclosure.

An alternative package for an LED 56 is illustrated in FIG. 12 wherein the LED chip 58 is mounted on a substrate 72. In particular, the ohmic contacts for the anode (or cathode) of the LED chip 58 are directly mounted to first contact pads 74 on the surface of the substrate 72. The ohmic contacts for the cathode (or anode) of the LED chip 58 are connected to second contact pads 76, which are also on the surface of the substrate 72, using bond wires 78. The LED chip 58 resides in a cavity of a reflector structure 80, which is formed from a reflective material and functions to reflect light emitted from the LED chip 58 through the opening formed by the reflector structure 80. The cavity formed by the reflector structure 80 may be filled with an encapsulant material 68 that encapsulates the LED chip 58. The encapsulant material 68 may be clear or contain a wavelength conversion material, such as a phosphor.

In either of the embodiments of FIGS. 11 and 12, if the encapsulant material 68 is clear, the light emitted by the LED chip 58 passes through the encapsulant material 68 and the protective resin 70 without any substantial shift in color. As such, the light emitted from the LED chip 58 is effectively the light emitted from the LED 56. If the encapsulant material 68 contains a wavelength conversion material, substantially all or a portion of the light emitted by the LED chip 58 in a first wavelength range may be absorbed by the wavelength conversion material, which will responsively emit light in a second wavelength range. The concentration and type of wavelength conversion material will dictate how much of the light emitted by the LED chip 58 is absorbed by the wavelength conversion material as well as the extent of the wavelength conversion. In embodiments where some of the light emitted by the LED chip 58 passes through the wavelength conversion material without being absorbed, the light passing through the wavelength conversion material will mix with the light emitted by the wavelength conversion material. Thus, when a wavelength conversion material is used, the light emitted from the LED 56 is shifted in color from the actual light emitted from the LED chip 58.

For example, the LED array 20 may include a group of BSY or BSG LEDs 56 as well as a group of red LEDs 56. BSY LEDs 56 include an LED chip 58 that emits bluish light, and the wavelength conversion material is a yellow phosphor that absorbs the blue light and emits yellowish light. Even if some of the bluish light passes through the phosphor, the resultant mix of light emitted from the overall BSY LED 56 is yellowish light. The yellowish light emitted from a BSY LED 56 has a color point that falls above the Black Body Locus (BBL) on the 1976 CIE chromaticity diagram wherein the BBL corresponds to the various color temperatures of white light.

Similarly, BSG LEDs 56 include an LED chip 58 that emits bluish light; however, the wavelength conversion material is a greenish phosphor that absorbs the blue light and emits greenish light. Even if some of the bluish light passes through the phosphor, the resultant mix of light emitted from the overall BSG LED 56 is greenish light. The greenish light emitted from a BSG LED 56 has a color point that falls above the BBL on the 1976 CIE chromaticity diagram wherein the BBL corresponds to the various color temperatures of white light.

The red LEDs 56 generally emit reddish light at a color point on the opposite side of the BBL as the yellowish or greenish light of the BSY or BSG LEDs 56. As such, the reddish light from the red LEDs 56 may mix with the yellowish or greenish light emitted from the BSY or BSG LEDs 56 to generate white light that has a desired color temperature and falls within a desired proximity of the BBL. In effect, the reddish light from the red LEDs 56 pulls the yellowish or greenish light from the BSY or BSG LEDs 56 to a desired color point on or near the BBL. Notably, the red LEDs 56 may have LED chips 58 that natively emit reddish light wherein no wavelength conversion material is employed. Alternatively, the LED chips 58 may be associated with a wavelength conversion material, wherein the resultant light emitted from the wavelength conversion material and any light that is emitted from the LED chips 58 without being absorbed by the wavelength conversion material mixes to form the desired reddish light.

The blue LED chip 58 used to form either the BSY or BSG LEDs 56 may be formed from a gallium nitride (GaN), indium gallium nitride (InGaN), silicon carbide (SiC), zinc selenide (ZnSe), or like material system. The red LED chip 58 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein.

Figure 13:
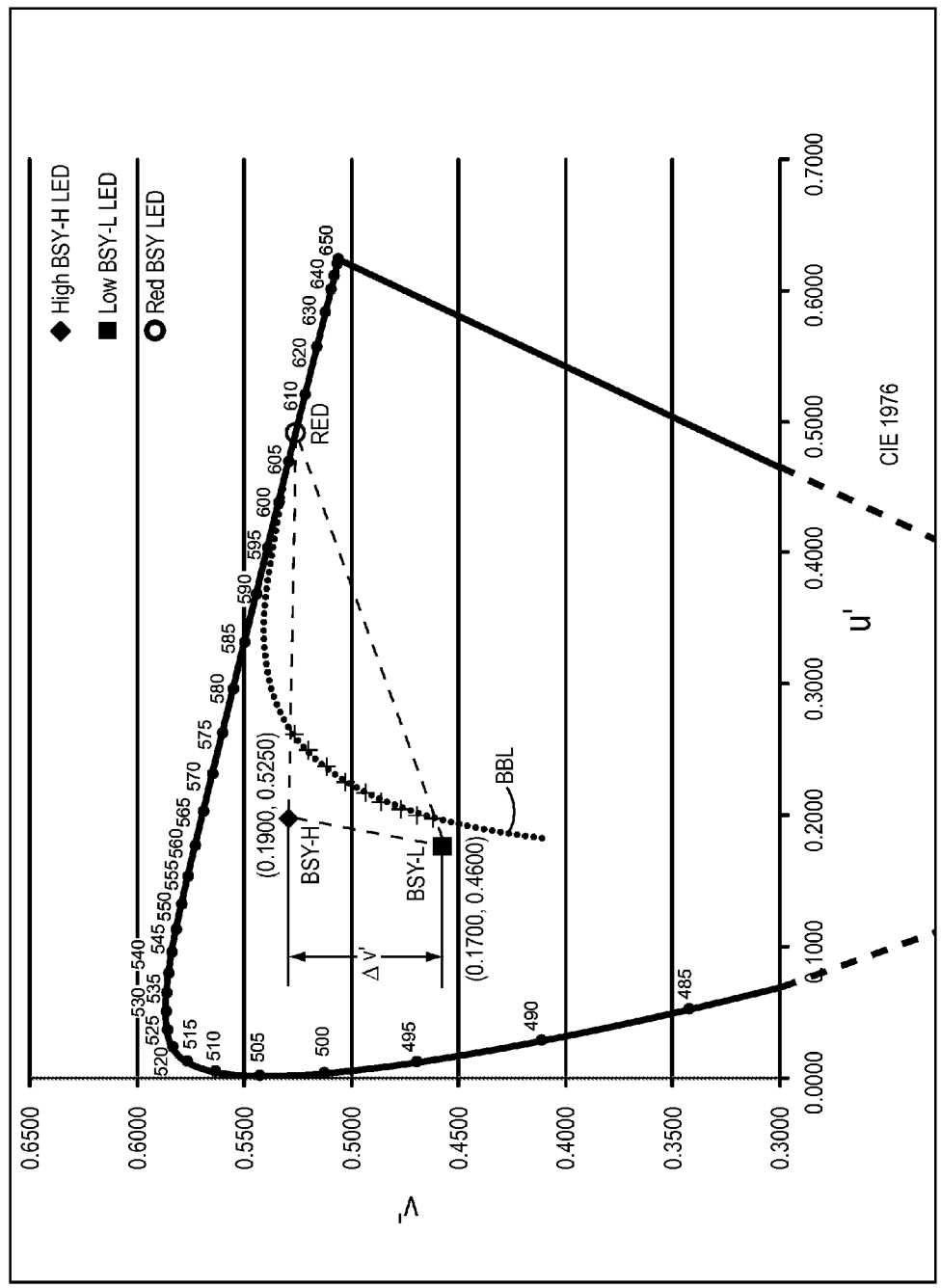
FIG. 13 is CIE 1976 chromaticity diagram that illustrates the color points for three different LEDs and a black body locus.

The International Commission on Illumination (Commission internationale de l'éclairage, or CIE) has defined various chromaticity diagrams over the years. The chromaticity diagrams are used to project a color space that represents all human perceivable colors without reference to brightness or luminance. FIG. 13 illustrates a CIE 1976 chromaticity diagram, which includes a portion of a Planckian locus, or black body locus (BBL). The BBL is a path within the color space that the color of an incandescent black body would travel as the temperature of the black body changes. While the color of the incandescent body may range from an orangish-red to blue, the middle portions of the path encompass what is traditionally considered as "white light."

Correlated Color Temperature (CCT), or color temperature, is used to characterize white light. CCT is measured in kelvin (K) and defined by the Illuminating Engineering Society of North America (IESNA) as "the absolute temperature of a blackbody whose chromaticity most nearly resembles that of the light source." Light output that is:

below 3200 K is a yellowish white and generally considered to be warm (white) light;
  between 3200 K and 4000 K is generally considered neutral (white) light; and
  above 4000 K is bluish-white and generally considered to be cool (white) light.

The coordinates (u', v') are used to define color points within the color space of the CIE 1976 chromaticity diagram. The v' value defines a vertical position and the u' value defines a horizontal position. As an example, the color points for a first BSY LED 56 is about (0.1900, 0.5250), a second BSY LED 56 is about (0.1700, 0.4600), and a red LED 56 is about (0.4900, 0.5600). Notably, the first and second BSY LEDs 56 are significantly spaced apart from one another along the v' axis. As such, the first BSY LED 56 is much higher than the second BSY LED 56 in the chromaticity diagram. For ease of reference, the higher, first BSY LED 56 is referenced as the high BSY-H LED, and the lower, second BSY LED 56 is referenced as the low BSY-L LED.

As such, the Δv' for the high BSY-H LED and the low BSY-L LED is about 0.065 in the illustrated example. In different embodiments, the Δv' may be greater than 0.025, 0.030, 0.033, 0.040, 0.050, 0.060, 0.075, 0.100, 0.110, and 0.120, respectively. Exemplary, but not absolute upper bounds for Δv' may be 0.150, 0.175, or 0.200 for any of the aforementioned lower bounds. For groups of LEDs of a particular color, the Δv' between two groups of LEDs is the difference between the average v' values for each group of LEDs. As such, the Δv' between groups of LEDs of a particular color may also be greater than 0.030, 0.033, 0.040, 0.050, 0.060, 0.075, 0.100, 0.110, and 0.120, respectively, with the same upper bounds as described above. Further, the variation of color points among the LEDs 56 within a particular group of LEDs may be limited to within a seven, five, four, three, or two-step MacAdam ellipse in certain embodiments. In general, the greater the delta v', the larger the range through which the CCT of the white light can be adjusted along the black body locus. The closer the white light is to the black body locus, the more closely the white light will replicate that of an incandescent radiator.

In one embodiment, the LED array 20 includes a first LED group of only low BSY-L LEDs, a second LED group of only high BSY-H LEDs, and a third LED group of only red LEDs. The currents used to drive the first, second, and third LED groups may be independently controlled such that the intensity of the light output from the first, second, and third LED groups is independently controlled. As such, the light output for the first, second, and third LED groups may be blended or mixed to create a light output that has an overall color point virtually anywhere within a triangle formed by the color points of the respective low BSY-L LEDs, high BSY-H LEDs, and the red LEDs. Within this triangle resides a significant portion of the BBL, and as such, the overall color point of the light output may be dynamically adjusted to fall along the portion of the BBL that resides within the triangle.

A crosshatch pattern highlights the portion of the BBL that falls within the triangle. Adjusting the overall color point of the light output along the BBL corresponds to adjusting the CCT of the light output, which as noted above is considered white light when falling on the BBL. In one embodiment, the CCT of the overall light output may be adjusted over a range from about 2700 K to about 5700 K. In another embodiment, the CCT of the overall light output may be adjusted over a range from about 3000 K to 5000 K. In yet another embodiment, the CCT of the overall light output may be adjusted over a range from about 2700 K to 5000 K. In yet another embodiment, the CCT of the overall light output may be adjusted over a range from about 3000 K to 4000 K. These variations in CCT can be accomplished while maintaining a high color rendering index value (CRI), such as a CRI equal to or greater than 90.

To be considered "white" light, the overall color point does not have to fall precisely on the BBL. Unless defined otherwise and for the purposes of this application only, a color point within a five-step MacAdam ellipse of the BBL is defined as white light on the BBL. For tighter tolerances, four, three, and two-step MacAdam ellipses may be defined.

Figure 14:
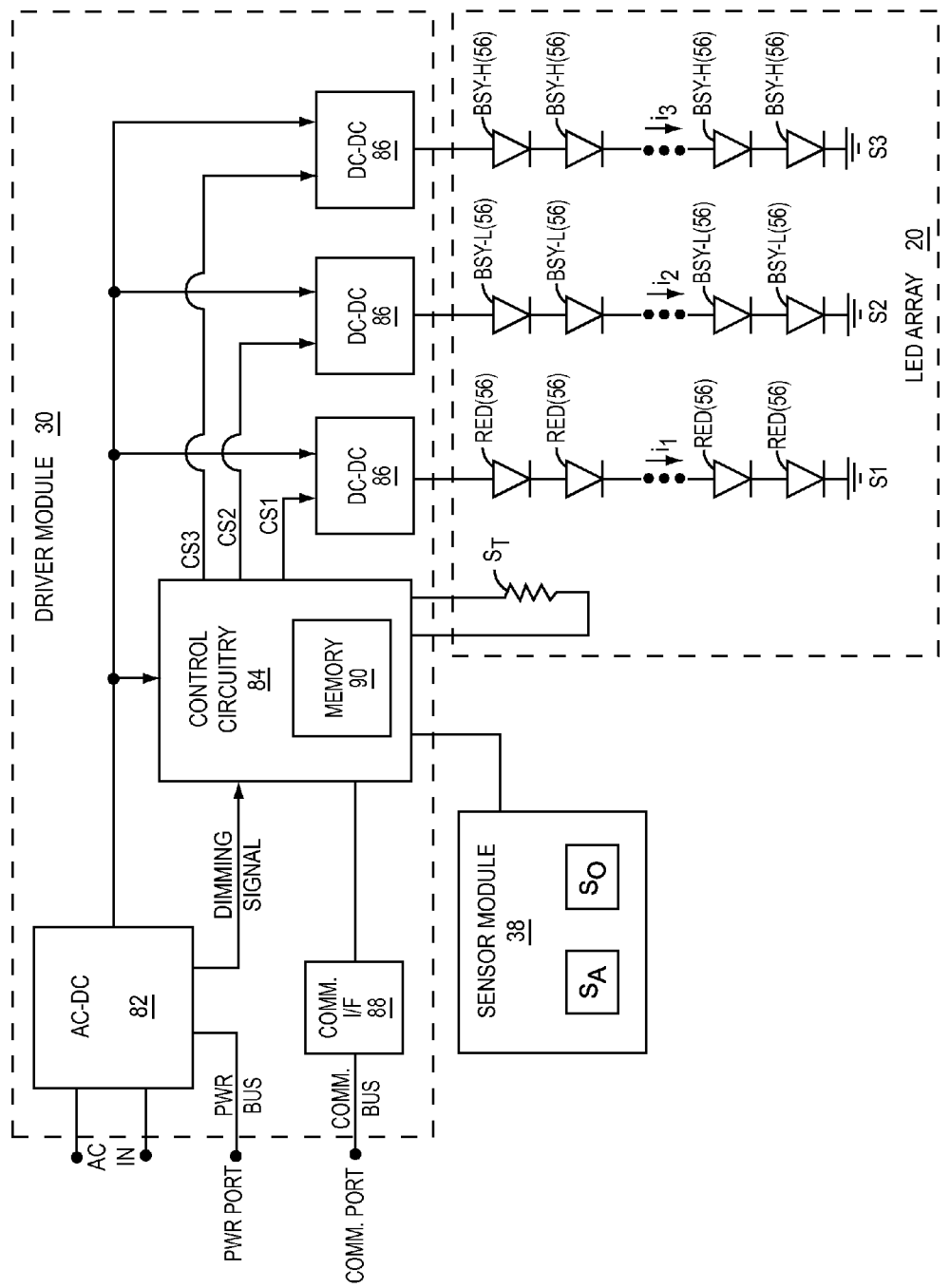
FIG. 14 is a schematic of a driver module and an LED array according to one embodiment of the disclosure.

As noted, the LED array 20 may include a mixture of red LEDs 56, high BSY-H LEDs 56, and low BSY-L LEDs 56. The driver module 30 for driving the LED array 20 is illustrated in FIG. 14, according to one embodiment of the disclosure. The LED array 20 may be divided into multiple strings of series connected LEDs 56. In essence, LED string S1, which includes a number of red LEDs (RED), forms a first group of LEDs 56. LED string S2, which includes a number of low BSY LEDs (BSY-L), forms a second group of LEDs 56. And, LED string S3, which includes a number of high BSY LEDs (BSY-H), forms a third group of LEDs 56.

For clarity, the various LEDs 56 of the LED array 20 are referenced as RED, BSY-L, and BSY-H in FIG. 14 to clearly indicate which LEDs are located in the various LED strings S1, S2, and S3. While BSY LEDs 56 are illustrated, BSG or other phosphor-coated, wavelength converted LEDs may be employed in analogous fashion. For example, a string of high BSG-H LEDs 56 may be combined with a string of low BSG-L LEDs 56, and vice versa. Further, a string of low BSY-H LEDs may be combined with a string of high BSG-H LEDs, and vice versa. Non-phosphor-coated LEDs, such as non-wavelength converted red, green, and blue LEDs, may also be employed in certain embodiments.

In general, the driver module 30 controls the currents $i_1$, $i_2$, and $i_3$, which drive the respective LED strings S1, S2, and S3. The ratio of currents $i_1$, $i_2$, and $i_3$ that are provided through respective LED strings S1, S2, and S3 may be adjusted to effectively control the relative intensities of the reddish light emitted from the red LEDs 56 of LED string S1, the yellowish/greenish light emitted from the low BSY-L LEDs 56 of LED string S2, and the yellow/greenish light emitted from the high BSY-H LEDs 56 of LED string S3. The resultant light from each LED string S1, S2, and S3 mixes to generate an overall light output that has a desired color, CCT, and intensity, the later of which may also be referred to a dimming level. As noted, the overall light output may be white light that falls on or within a desired proximity of the BBL and has a desired CCT.

The number of LED strings Sx may vary from one to many and different combinations of LED colors may be used in the different strings. Each LED string Sx may have LEDs 56 of the same color, variations of the same color, or substantially different colors. In the illustrated embodiment, each LED string S1, S2, and S3 is configured such that all of the LEDs 56 that are in the string are all essentially identical in color. However, the LEDs 56 in each string may vary substantially in color or be completely different colors in certain embodiments. In another embodiment, three LED strings Sx with red, green, and blue LEDs may be used, wherein each LED string Sx is dedicated to a single color. In yet another embodiment, at least two LED strings Sx may be used, wherein different colored BSY or BSG LEDs are used in one of the LED strings Sx and red LEDs are used in the other of the LED strings Sx. A single string embodiment is also envisioned, where currents may be individually adjusted for the LEDs of the different colors using bypass circuits, or the like.

The driver module 30 depicted in FIG. 14 generally includes AC-DC conversion circuitry 82, control circuitry 84, and a number of current sources, such as the illustrated DC-DC converters 86. The AC-DC conversion circuitry 82 is adapted to receive an AC power signal (AC IN), rectify the AC power signal, correct the power factor of the AC power signal, and provide a DC output signal. The DC output signal may be used to directly power the control circuitry 84 and any other circuitry provided in the driver module 30, including the DC-DC converters 86, a communication interface 88, as well as the sensor module 38.

The DC output signal may also be provided to the power bus, which is coupled to one or more power ports, which may be part of the standard communication interface. The DC output signal provided to the power bus may be used to provide power to one or more external devices that are coupled to the power bus and separate from the driver module 30. These external devices may include the communications module 32 and any number of auxiliary devices, such as the sensor module 38. Accordingly, these external devices may rely on the driver module 30 for power and can be efficiently and cost effectively designed accordingly. The AC-DC conversion circuitry 82 of the driver module 30 is robustly designed in anticipation of being required to supply power to not only its internal circuitry and the LED array 20, but also to supply power to these external devices. Such a design greatly simplifies the power supply design, if not eliminating the need for a power supply, and reduces the cost for these external devices.

As illustrated, the three respective DC-DC converters 86 of the driver module 30 provide currents $i_1$, $i_2$, and $i_3$ for the three LED strings S1, S2, and S3 in response to control signals CS1, CS2, and CS3. The control signals CS1, CS2, and CS3 may be pulse width modulated (PWM) signals that effectively turn the respective DC-DC converters on during a logic high state and off during a logic low state of each period of the PWM signal. In one embodiment the control signals CS1, CS2, and CS3 are the product of two PWM signals.

The first PWM signal is a higher frequency PWM signal that has a duty cycle that effectively sets the DC current level through a corresponding one of LED strings S1, S2, and S3, when current is allowed to pass through the LED strings S1, S2, and S3. The second PWM signal is a lower frequency signal that has a duty cycle that corresponds a desired dimming or overall output level. In essence, the higher frequency PWM signals set the relative current levels though each LED string S1, S2, and S3 while the lower frequency PWM signal determines how long the currents $i_1$, $i_2$, and $i_3$ are allowed to pass through the LED strings S1, S2, and S3 during each period of the lower frequency PWM signal. The longer the currents $i_1$, $i_2$, and $i_3$ are allowed to flow through the LED strings S1, S2, and S3 during each period, the higher the output level, and vice versa. Given the reactive components associated with the DC-DC converters 86, the relative current levels set with the higher frequency PWM signals may be filtered to a relative DC current. However, this DC current is essentially pulsed on and off based on the duty cycle of the lower frequency PWM signal. For example, the higher frequency PWM signal may have a switching frequency of around 200 KHz, while the lower frequency PWM signal may have a switching frequency of around 1 KHz.

In certain instances, a dimming device may control the AC power signal. The AC-DC conversion circuitry 82 may be configured to detect the relative amount of dimming associated with the AC power signal and provide a corresponding dimming signal to the control circuitry 84. Based on the dimming signal, the control circuitry 84 will adjust the currents $i_1$, $i_2$, and $i_3$ provided to each of the LED strings S1, S2, and S3 to effectively reduce the intensity of the resultant light emitted from the LED strings S1, S2, and S3 while maintaining the desired CCT. As described further below, the CCT and dimming levels may be initiated internally or received from the commissioning tool 36, a wall controller, or another lighting fixture 10. If received from an external device via the communications module 32, the CCT and/or dimming levels are delivered from the communications module 32 to the control circuitry 84 of the driver module 30 in the form of a command via the communication bus. The driver module 30 will respond by controlling the currents $i_1$, $i_2$, and $i_3$ in the desired manner to achieve the requested CCT and/or dimming levels.

The intensity and CCT of the light emitted from the LEDs 56 may be affected by temperature. If associated with a thermistor $S_T$ or other temperature-sensing device, the control circuitry 84 can control the currents $i_1$, $i_2$, and $i_3$ provided to each of the LED strings S1, S2, and S3 based on ambient temperature of the LED array 20 in an effort to compensate for temperature effects. The control circuitry 84 may also monitor the output of the occupancy and ambient light sensors $S_O$ and $S_A$ for occupancy and ambient light information and further control the currents $i_1$, $i_2$, and $i_3$ in a desired fashion. Each of the LED strings S1, S2, and S3 may have different temperature compensation adjustments, which may also be functions of the magnitude of the various currents $i_1$, $i_2$, and $i_3$.

The control circuitry 84 may include a central processing unit (CPU) and sufficient memory 90 to enable the control circuitry 84 to bidirectionally communicate with the communications module 32 or other devices over the communication bus through an appropriate communication interface (I/F) 88 using a defined protocol, such as the standard protocol described above. The control circuitry 84 may receive instructions from the communications module 32 or other device and take appropriate action to implement the received instructions. The instructions may range from controlling how the LEDs 56 of the LED array 20 are driven to returning operational data, such as temperature, occupancy, light output, or ambient light information, that was collected by the control circuitry 84 to the communications module 32 or other device via the communication bus. Notably, the functionality of the communications module 32 may be integrated into the driver module 30, and vice versa.

Figure 15:
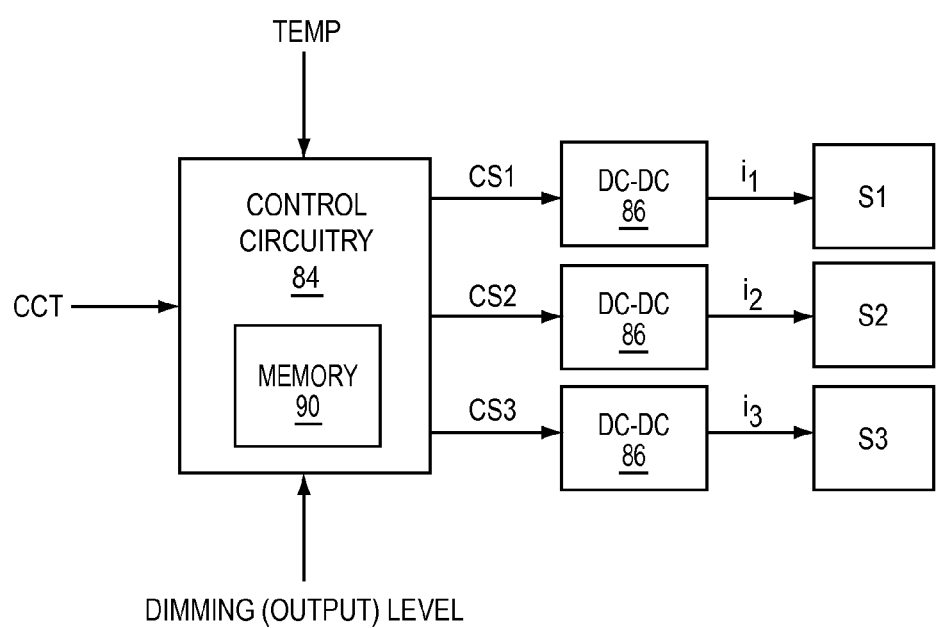
FIG. 15 illustrates a functional schematic of the driver module of FIG. 14.

With reference to FIG. 15, an exemplary way to control the currents $i_1$, $i_2$, and $i_3$, which are provided to the respective LED strings S1, S2, and S3 is illustrated, such that the CCT of the overall light output can be finely tuned over a relatively long range and throughout virtually any dimming level. As noted above, the control circuitry 84 generates control signals CS1, CS2, and CS3, which control the currents $i_1$, $i_2$, and $i_3$. Those skilled in the art will recognize other ways to control the currents $i_1$, $i_2$, and $i_3$.

In essence, the control circuitry 84 of the driver module 30 is loaded with a current model in the form of one or more functions (equation) or look up tables for each of the currents $i_1$, $i_2$, and $i_3$. Each current model is a reference model that is a function of dimming or output level, temperature, and CCT. The output of each model provides a corresponding control signal CS1, CS2, and CS3, which effectively sets the currents $i_1$, $i_2$, and $i_3$ in the LED strings S1, S2, and S3. The three current models are related to each other. At any given output level, temperature, and CCT, the resulting currents $i_1$, $i_2$, and $i_3$ cause the LED strings S1, S2, and S3 to emit light, which when combined, provides an overall light output that has a desired output level and CCT, regardless of temperature. While the three current models do not need to be a function of each other, they are created to coordinate with one another to ensure that the light from each of the strings S1, S2, and S3 mix with one another in a desired fashion.

Figure 16:
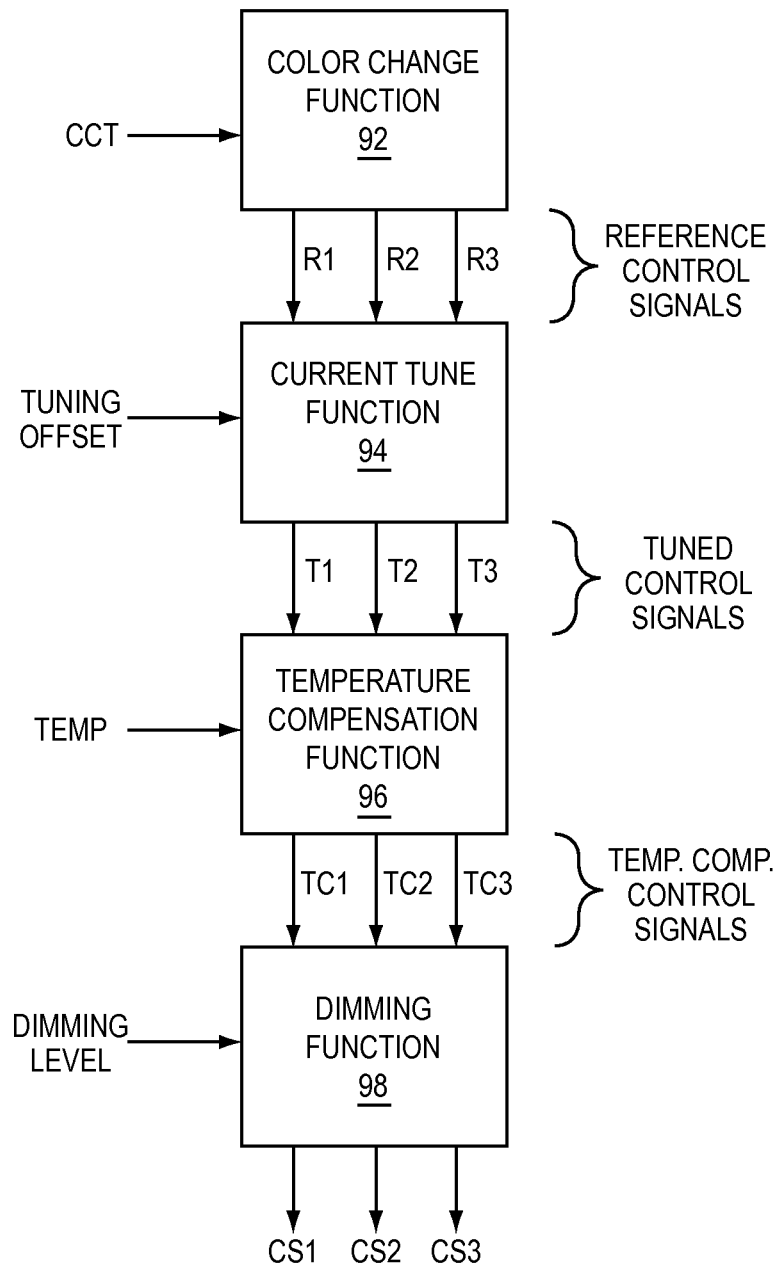
FIG. 16 is a flow diagram that illustrates the functionality of the driver module according to one embodiment.

With reference to FIG. 16, an exemplary process for generating the control signals CS1, CS2, and CS3 is provided. Initially, assume that the current models are loaded in the memory 90 of the control circuitry 84. Further assume that the current models are reference models for the particular type of lighting fixture 10.

Further assume that the desired CCT is input to a color change function 92, which is based on the reference models. The color change function 92 selects reference control signals R1, R2, and R3 for each of the currents $i_1$, $i_2$, and $i_3$ based on the desired CCT. Next, the reference control signals R1, R2, and R3 are each adjusted, if necessary, by a current tune function 94 based on a set of tuning offsets. The turning offsets may be determined through a calibration process during manufacturing or testing and uploaded into the control circuitry 84. The tuning offset correlates to a calibration adjustment to the currents $i_1$, $i_2$, and $i_3$ that should be applied to get the CCT of the overall light output to match a reference CCT. Details about the tuning offsets are discussed further below. In essence, the current tune function 94 modifies the reference control signals R1, R2, and R3 based on the tuning offsets to provide tuned control signals T1, T2, and T3.

In a similar fashion, the temperature compensation function 96 modifies the tuned control signals T1, T2, and T3 based on the current temperature measurements to provide temperature compensated control signals TC1, TC2, and TC3. Since light output from the various LEDs 56 may vary in intensity and color over temperature, the temperature compensation function 96 effectively adjusts the currents $i_1$, $i_2$, and $i_3$ to substantially counter the effect of these variations. The temperature sensor $S_T$ may provide the temperature input and is generally located near the LED array 20.

Finally, the dimming function 98 modifies the temperature compensated control signals TC1, TC2, and TC3 based on the desired dimming (output) levels to provide the controls signals CS1, CS2, and CS3, which drive the DC-DC converters 86 to provide the appropriate currents $i_1$, $i_2$, and $i_3$ to the LED strings S1, S2, and S3. Since light output from the various LEDs 56 may also vary in relative intensity and color over varying current levels, the dimming function 98 helps to ensure that the CCT of the overall light output corresponds to the desired CCT and intensity at the selected dimming (output) levels.

A wall controller, commissioning tool 36, or other lighting fixture 10 may provide the CCT setting and dimming levels. Further, the control circuitry 84 may be programmed to set the CCT and dimming levels according to a defined schedule, state of the occupancy and ambient light sensors $S_O$ and $S_A$, other outside control input, time of day, day of week, date, or any combination thereof. For example, these levels may be controlled based on a desired efficiency or correlated color temperature.

These levels may be controlled based on the intensity (level) and/or spectral content of the ambient light, which is measured by the ambient light sensor $S_A$. When controlled based on spectral content, the dimming or CCT levels may be adjusted based on the overall intensity of the ambient light. Alternatively, the dimming levels, color point, or CCT levels may be adjusted to either match the spectral content of the ambient light or help fill in spectral areas of the ambient light that are missing or attenuated. For example, if the ambient light is deficient in a cooler area of the spectrum, the light output may be adjusted to provide more light in that cooler area of the spectrum, such that the ambient light and light provided by the lighting fixtures 10 combine to provide a desired spectrum. CCT, dimming, or color levels may also be controlled based on power conditions (power outage, battery backup operation, etc.), or emergency conditions (fire alarm, security alarm, weather warning, etc.).

Figure 17:
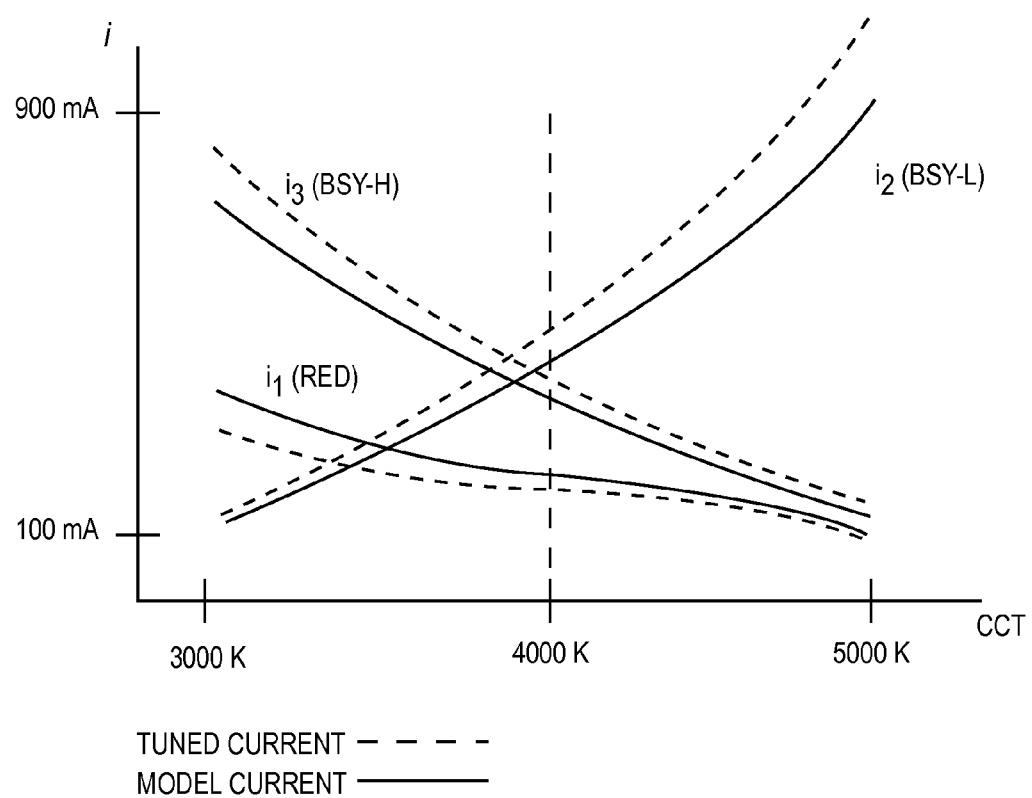
FIG. 17 is a graph that plots individual LED current versus CCT for overall light output according to one embodiment.

As noted, the tuning offset is generally determined during manufacture, but may also be determined and loaded into the lighting fixture 10 in the field. The tuning offset is stored in memory 90 and correlates to a calibration adjustment to the currents $i_1$, $i_2$, and $i_3$ that should be applied to get the CCT of the overall light output to match a reference CCT. With reference to FIG. 17, exemplary current curves are provided for reference (pre-tuned) currents and tuned (post-tuned) currents $i_1$, $i_2$, and $i_3$ over a CCT range of about 3000 K to 5000 K. The reference currents represent the currents $i_1$, $i_2$, and $i_3$ that are expected to provide a desired CCT in response to the reference control signals R1, R2, and R3 for the desired CCT. However, the actual CCT that is provided in response to the reference currents $i_1$, $i_2$, and $i_3$ may not match the desired CCT based on variations in the electronics in the driver module 30 and the LED array 20. As such, the reference currents $i_1$, $i_2$, and $i_3$ may need to be calibrated or adjusted to ensure that the actual CCT corresponds to the desired CCT. The tuning offset represents the difference between the curves for the model and tuned currents $i_1$, $i_2$, and $i_3$.

For single-point calibration, the tuning offset may be fixed multipliers that can be applied over the desired CCT range for the corresponding reference currents $i_1$, $i_2$, and $i_3$. Applying the fixed multipliers represents multiplying the reference currents $i_1$, $i_2$, and $i_3$ by corresponding percentages. In FIG. 13, the tuning offsets for the reference currents $i_1$, $i_2$, and $i_3$ may be 0.96 (96%), 1.04 (104%), and 1.06 (106%), respectively. As such, as reference currents $i_2$, and $i_3$ increase, the tuned currents $i_2$, and $i_3$ will increase at a greater rate. As reference current $i_1$ increases, the tuned current $i_1$ will increase at a lessor rate.

For example, a single calibration may take place at 25 C and a CCT of 4000 K wherein the tuning offsets are determined for each of the currents $i_1$, $i_2$, and $i_3$. The resultant tuning offsets for the currents $i_1$, $i_2$, and $i_3$ at 25 C and 4000 K may be applied to the respective model current curves. The effect is to shift each current curve up or down by a fixed percentage. As such, the same tuning offsets that are needed for currents $i_1$, $i_2$, and $i_3$ at 4000 K are applied at any selected CCT between 3000 K and 5000 K. The tuning offsets are implemented by multiplying the reference control signals R1, R2, and R3 by a percentage that causes the currents $i_1$, $i_2$, and $i_3$ to increase or decrease. As noted above, the reference control signals R1, R2, and R3 are altered with the tuning offsets to provide the tuned control signals T1, T2, and T3. The tuned control signals T1, T2, and T3 may be dynamically adjusted to compensate for temperature and dimming (output) levels.

While the fixed percentage-based tuning offsets may be used for calibration and manufacturing efficiency, other tuning offsets may be derived and applied. For example, the tuning offsets may be fixed magnitude offsets that are equally applied to all currents regardless of the CCT value. In a more complex scenario, an offset function can be derived for each of the currents $i_1$, $i_2$, and $i_3$ and applied to the control signals CS1, CS2, and CS3 over the CCT range.

The lighting fixture 10 need not immediately change from one CCT level to another in response to a user or other device changing the selected CCT level. The lighting fixture 10 may employ a fade rate, which dictates the rate of change for CCT when transitioning from one CCT level to another. The fade rate may be set during manufacture, by the commissioning tool 36, wall controller, or the like. For example, the fade rate could be 500 K per second. Assume the CCT levels for a 5% dimming level and a 74% dimming level are 3000 K and 5000 K, respectively. If the user or some event changed the dimming level from 5% to 74%, the CCT level may transition from 3000 K to 5000 K at a rate of 500 K per second. The transition in this example would take two seconds. The dimming rate may or may not coincide with the CCT fade rate. With a fade rate, changes in the selected CCT level may be transitioned in a gradual fashion to avoid abrupt switches from one CCT level to another.

Figure 18:
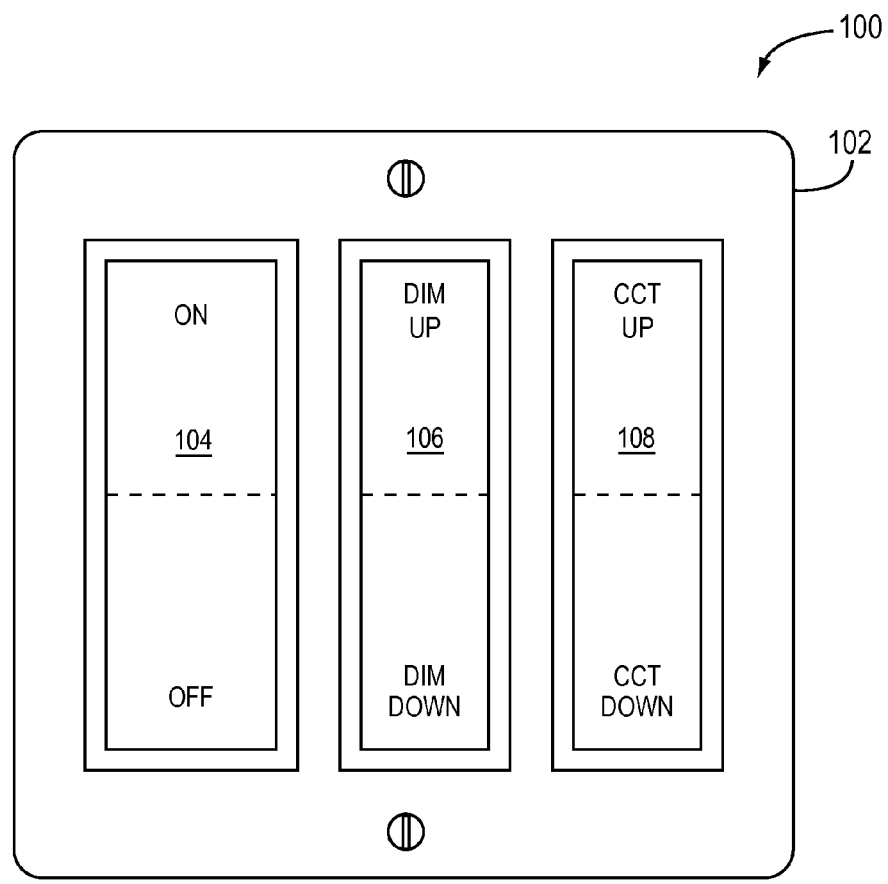
FIG. 18 is a wall controller for controlling one or more lighting fixtures according to a first embodiment.

With reference to FIG. 18, an exemplary wall controller 100, such as wall controller WCA and WCB of FIG. 1, is illustrated. The wall controller 100 is shown in this embodiment with three buttons: an on-off button 104, a dimming button 106, and a CCT button 108. As will be described further below, the wall controller 100 may be hardwired to one or more lighting fixtures 10 or be configured to wirelessly communicate directly or indirectly with one or more lighting fixtures 10. The wired or wireless communications will support delivery of signals, messages, or instructions, which are hereafter referred to as signals, to the lighting fixtures 10. The wall controllers 100 may be configured to simply relay the various user inputs to the associated lighting fixture(s) 10 as soon as the user inputs are received. In this case, the lighting fixtures 10 will process the user inputs to determine the appropriate response to take. When the wall controllers 100 act primarily as a relay, the primary intelligence, or decision-making capability, resides in the lighting fixture(s) 10. Alternatively, significant processing and decision-making capability may be provided in the wall controller 100, wherein the wall controller 100 may process the various user inputs and determine how to instruct the lighting fixture(s) 10 based on various criteria, such as program rules, sensor information from local or remote sensors, prior user input, and the like.

When discussing the various examples described below, either of these configurations, or combination thereof, may be employed. For the relay embodiment, the user input is relayed to one or more lighting fixtures 10, which will process the user input and provide the requisite lighting response. When the wall controller 100 needs to provide a user perceptible response, the response may be initiated internally by the wall controller 100 based on available information or provided in response to instructions received from the lighting fixture 10. For example, if the wall controller 100 needs to control an LED that is located on the wall controller 100 to provide user feedback, this may be initiated internally or in response to a signal from a lighting fixture 10. With a more intelligent wall controller 100, the wall controller 100 may simply instruct the associated lighting fixture 10 to provide a specific lighting response, such as dim to 50% with a CCT of 3500 K, and control the LED accordingly. The lighting fixture 10 need not be aware of the LED control in this case.

When equipped for wireless communications, the wall controller 100 may act as a node in a multi-node wireless mesh network wherein certain nodes are lighting fixtures 10. For further information regarding mesh-network based lighting networks, reference is made to U.S. patent application Ser. No. 13/782,022, filed Mar. 1, 2013, now U.S. Pat. No. 9,155,165; U.S. Pat. No. 8,975,827; U.S. patent application Ser. No. 13/782,053, filed Mar. 1, 2013, now U.S. Pat. No. 9,155,166; U.S. patent application Ser. No. 13/782,068, filed Mar. 1, 2013; U.S. Pat. No. 8,829,821; U.S. patent application Ser. No. 13/782,096, filed Mar. 1, 2013; U.S. Pat. No. 8,912,735; U.S. patent application Ser. No. 13/838,398, filed Mar. 15, 2013; U.S. patent application Ser. No. 13/868,021, filed Apr. 22, 2013; and U.S. provisional patent application No. 61/932,058, filed Jan. 27, 2014, which are incorporated herein by reference in their entireties.

With the embodiment illustrated in FIG. 18, each of the three buttons (104, 106, 108) are shown as rocker switches, wherein pressing the top half of the button invokes a first lighting control response and the pressing the bottom half of the button invokes a second lighting control response. For the on-off button 104, pressing the top half will result in the wall controller 100 sending a signal to turn on any associated lighting fixture(s) 10. Pressing the bottom half of the on-off button 104 will result in the wall controller sending a signal to turn off the associated lighting fixture(s) 10. As with any of these signals, the signals may be sent directly or indirectly through a network to the associated lighting fixture(s) 10.

The dimming button 106 is used to vary the light output level, or dimming level, of the associated lighting fixture(s) 10. For the dimming button 106, pressing the top half will result in the wall controller 100 sending a signal to increase the output light level of the associated lighting fixture(s) 10. Pressing the bottom half of the dimming button 106 will result in the wall controller sending a signal to decrease the output light level of the associated lighting fixture(s) 10. With each press of the top half or bottom half of the dimming button 106, the associated lighting fixture(s) 10 may be instructed to increase or decrease their output light levels by a defined amount. If the top half or bottom half of the dimming button 106 is held down, the associated lighting fixture(s) 10 may be instructed to continuously increase or decrease their output levels until the dimming button 106 is released.

The CCT button 108 is used to vary the CCT of the light output of the associated lighting fixture(s) 10. For the CCT button 108, pressing the top half will result in the wall controller 100 sending a signal to increase the CCT level of the associated lighting fixture(s) 10. Pressing the bottom half of the CCT button 108 will result in the wall controller sending a signal to decrease the CCT level of the associated lighting fixture(s) 10. With each press of the top half or bottom half of the CCT button 108, the associated lighting fixture(s) 10 may be instructed to increase or decrease their CCT by a defined amount. For example, each press of the top half or bottom half of the CCT button 108 may result in an increase or decrease of the CCT of the light output of the associated lighting fixture(s) 10 by 100 K. Alternately, each press could result in a 1, 5, 10, 50, 100, 250, or 500 K change in light output. If the top half or bottom half of the CCT button 108 is held down, the associated lighting fixture(s) 10 may be instructed to continuously increase or decrease their CCT levels until the CCT button 108 is released. The rate of change may be fixed or may change based on how long the CCT button 108 is held down. The longer the CCT button 108 is depressed, the faster the change in CCT. For variations on wall controller configurations, please refer to U.S. patent application Ser. No. 14/292,332, filed May 30, 2014, which is incorporated herein by reference in its entirety.

Figure 19:
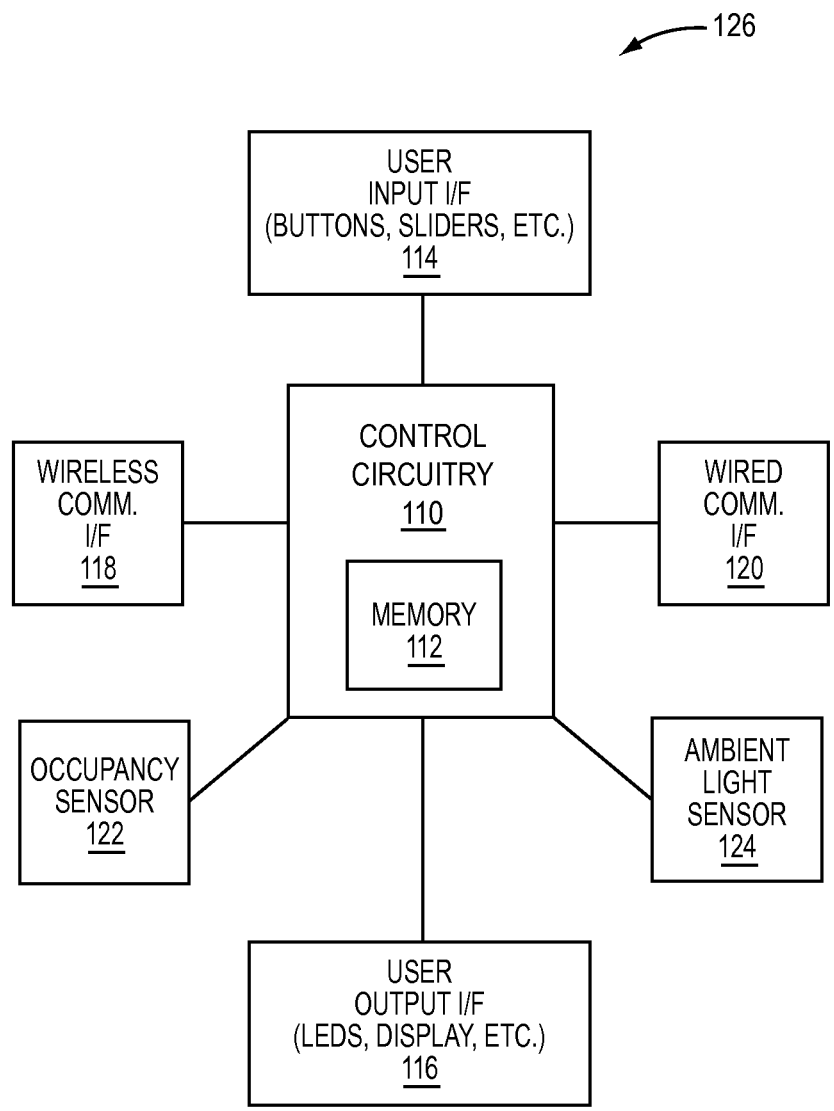
FIG. 19 is a schematic for a wall controller according to one embodiment.

An exemplary block diagram of the wall controller 100 is shown in FIG. 19. The wall controller 100 includes control circuitry 110, which is associated with memory 112 and configured to run the requisite software or firmware necessary to implement the functionality described herein. The control circuitry is associated with a user input interface (I/F) 114 and a user output interface (I/F) 116. As noted above, the user input interface 114 may include the various switches, rotary knobs, sliders, and buttons, such as the on-off button 104, dimming button 106, CCT button 108, and the like. The user input interface 114 may be arranged in various groups of switches, knobs, sliders, and buttons. The user input interface could also be a touch screen interface. The user output interface 116 may include LEDs or indicators, a display, or the like. The display could form part of a touch screen interface.

The control circuitry 110 is also associated with one or both of a wireless communication interface 118 and a wired communication interface 120. The wireless communication interface 118 is configured to facilitate wireless communication directly with one or more associated lighting fixtures 10, a wireless network that includes the associated lighting fixtures 10, or the like. Virtually any type of wireless communication technique may be used including Bluetooth, wireless local area network (WLAN), and the like. Even infrared, acoustic, and optical communication techniques are possible.

In one embodiment, the wireless communication interface 118 is capable of communicating with the communication module 32 of at least one of the associated lighting fixtures 10. Each lighting fixture 10 may be configured to relay messages between other lighting fixtures 10 and the wall controller 100. The lighting fixtures 10 may also be able to receive a signal from a wall controller 100 and then control other lighting fixtures 10 based on that instruction. The wired communication interface 120 is designed to be directly wired to at least one of the associated lighting fixtures 10 and send the control signals over the wired connection.

In operation, the control circuitry 110 may receive user input via the user input interface 114 or information from the lighting fixtures 10 and commissioning tool 36. Based on this input or information, the control circuitry 110 can provide user feedback to the user via the user output interface 116, send instructions via an appropriate signal to one or more associated lighting fixtures 10 via the wireless or wired communication interfaces 118, 120, or both. For example, the control circuitry 110 can receive on-off commands, dimming levels, CCT settings, maximum or minimum CCT levels, and the like from the user input interface 114 as described above and provide output to the user via the user output interface 116 and the associated lighting fixtures 10. The signal provided to the lighting fixtures 10 may include the user input or instructions to turn on, turn off, set or transition to a certain CCT level, set or transition to a certain dimming level, and the like.

The wall controller 100 may also include various sensors, such as an occupancy sensor 122 and an ambient light sensor 124. The control circuitry 110 may simply relay the sensor outputs of the occupancy sensor 122 and the ambient light sensor 124 to the associated lighting fixtures 10 or use the sensor outputs to help determine how to control the associated lighting fixtures 10. For example, ambient light levels and occupancy information may affect whether the wall controller 100 will turn on or off the associated lighting fixtures 10 as well as what dimming levels and CCT levels to set based on a desired lighting schedule that is implemented in the wall controller 100, assuming the lighting schedule is not controlled by one of the associated lighting fixtures 10. The time of day, day of week, and date may also impact how the associated lighting fixtures 10 are controlled in general as well as in conjunction with the sensor outputs, user inputs, and the like.

All of the control circuitry discussed herein for the lighting fixtures 10, wall controllers 100, and commissioning tool 36 is defined as hardware based and configured to run software, firmware, and the like to implement the described functionality. These systems are able to keep track of the time of day and day of week to implement scheduled programming.

Those skilled in the art will recognize improvements and modifications to the embodiments of the present disclosure. For example, the techniques disclosed herein may be employed in a lighting fixture that uses waveguide technology, such as that provided in International Application No. PCT/US14/13937, filed Jan. 30, 2014, entitled "Optical Waveguide Bodies and Luminaires Utilizing Same," which claims the benefit of U.S. Provisional Patent Application No. 61/922,017, filed Dec. 30, 2013, entitled "Optical Waveguide Bodies and Luminaires Utilizing Same," and which is a continuation-in-part of U.S. patent application Ser. No. 13/842,521, filed Mar. 15, 2013, entitled "Optical Waveguides," the disclosures of which are incorporated herein by reference in their entireties.

All such improvements and modifications are considered within the scope of the concepts disclosed herein and the claims that follow.

What is claimed is:

1. A lighting fixture associated with a first group of lighting fixtures, which is located in the same environment as a second group of lighting fixtures, the lighting fixture comprising:
   a light source configured to emit light;
   an ambient light sensor; and
   circuitry configured to:

determine a reference output level for light emitted from the first group of lighting fixtures;

determine an actual lighting contribution for light emitted from the second group of lighting fixtures;

reduce the reference output level by the actual lighting contribution to provide an adjusted reference level that is a function of a target level; and monitor the ambient light sensor and regulate a light output level such that a measurement from the ambient light sensor corresponds to the target level.

2. The lighting fixture of claim 1 wherein the circuitry is configured to receive local dimming information that controls a dimming level for the first group of lighting fixtures and the target level is based on the adjusted reference level and the local dimming information.

3. The lighting fixture of claim 2 wherein the local dimming information corresponds to a percentage of a full output level for the light source and the target level corresponds to the percentage of the full output level multiplied by the adjusted reference level.

4. The lighting fixture of claim 1 wherein to determine the actual lighting contribution, the circuitry is further configured to:

determine a potential lighting contribution of the second group of lighting fixtures;

receive dimming information corresponding to a dimming level associated with the second group of lighting fixtures; and determine the actual lighting contribution based on the potential lighting contribution and the dimming information.

5. The lighting fixture of claim 4 wherein to determine the potential lighting contribution, the circuitry is further configured to:

for each lighting fixture in the second group of lighting fixtures, determine a difference in ambient light levels between the lighting fixture in the second group of lighting fixtures emitting light at a full output level and not emitting light; and sum the differences in the ambient light levels for each lighting fixture in the second group of lighting fixtures to determine the potential lighting contribution.

6. The lighting fixture of claim 5 wherein when determining the potential lighting contribution, the circuitry is configured to:

for each lighting fixture in the second group of lighting fixtures:

instruct the lighting fixtures in the second group of lighting fixtures to emit light at the full output level while other lighting fixtures in the second group of lighting fixtures remain at a set output level;

measure an ambient light level at the full output level when the lighting fixture in the second group of lighting fixtures is emitting light at the full output level;

instruct the lighting fixtures in the second group of lighting fixtures to not emit light while other lighting fixtures in the second group of lighting fixtures remain at a set output level; and measure the ambient light level when the lighting fixture in the second group of lighting fixtures is not emitting light.

7. The lighting fixture of claim 4 wherein to determine the potential lighting contribution, the circuitry is further configured to determine a difference in ambient light levels between all of the lighting fixtures in the second group of lighting fixtures emitting light at a full output level and not emitting light, wherein the difference in the ambient light levels corresponds to the potential lighting contribution.

8. The lighting fixture of claim 7 wherein when determining the potential lighting contribution, the circuitry is configured to:

instruct each of the lighting fixtures in the second group of lighting fixtures to emit light at the full output level at the same time;

measure an ambient light level at the full output level when the lighting fixtures in the second group of lighting fixtures are emitting light at the full output level;

instruct each of the lighting fixtures in the second group of lighting fixtures to not emit light at the same time; and measure the ambient light level when the lighting fixtures in the second group of lighting fixtures are not emitting light.

9. The lighting fixture of claim 4 wherein the dimming information is received from at least one of the lighting fixtures of the second group of lighting fixtures.

10. The lighting fixture of claim 9 wherein the at least one of the lighting fixtures of the second group of lighting fixtures comprises a plurality of lighting fixtures and the dimming information is received from each of the plurality of lighting fixtures.

11. The lighting fixture of claim 1 wherein to determine the reference output level for light emitted from the first group of lighting fixtures, the circuitry is configured to:

instruct each lighting fixture in the first group of lighting fixtures to output light at a full output level;

emit light from the light source at the full output level;

measure an ambient light level when the lighting fixtures in the first group of lighting fixtures are emitting light at the full output level;

instruct each lighting fixture in the first group of lighting fixtures to not output light;

stop emitting light from the light source;

measure the ambient light level when the lighting fixtures in the first group of lighting fixtures are not emitting light; and determine a difference between the ambient light level when the lighting fixtures in the first group of lighting fixtures are emitting light at the full output level and the ambient light level when the lighting fixtures in the first group of lighting fixtures are not emitting light, wherein the difference corresponds to the reference output level.

12. The lighting fixture of claim 1 wherein the first group of lighting fixtures only includes one lighting fixture.

13. The lighting fixture of claim 1 wherein the second group of lighting fixtures only includes one lighting fixture.

14. The lighting fixture of claim 1 wherein the first group of lighting fixtures comprises a plurality of lighting fixtures.

15. The lighting fixture of claim 1 wherein the second group of lighting fixtures comprises a plurality of lighting fixtures.

16. The lighting fixture of claim 1 wherein:

the circuitry is configured to receive local dimming information that controls a dimming level for the first group of lighting fixtures and the target level is based on the adjusted reference level and the local dimming information;

wherein to determine the reference output level for light emitted from the first group of lighting fixtures, the circuitry is configured to:

instruct each lighting fixture in the first group of lighting fixtures to output light at a full output level;
emit light from the light source at the full output level;
measure an ambient light level when the lighting fixtures in the first group of lighting fixtures are emitting light at the full output level;
instruct each lighting fixture in the first group of lighting fixtures to not output light;
stop emitting light from the light source;
measure the ambient light level when the lighting fixtures in the first group of lighting fixtures are not emitting light; and
determine a difference between the ambient light level when the lighting fixtures in the first group of lighting fixtures are emitting light at the full output level and the ambient light level when the lighting fixtures in the first group of lighting fixtures are not emitting light, wherein the difference corresponds to the reference output level; and
wherein to determine the actual lighting contribution, the circuitry is further configured to:
determine a potential lighting contribution of the second group of lighting fixtures;
receive dimming information corresponding to a dimming level associated with the second group of lighting fixtures; and
determine the actual lighting contribution based on the potential lighting contribution and the dimming information.

17. The lighting fixture of claim 16 wherein to determine the potential lighting contribution, the circuitry is further configured to:
for each lighting fixture in the second group of lighting fixtures, determine a difference in ambient light levels between the lighting fixture in the second group of lighting fixtures emitting light at the full output level and not emitting light; and
sum the differences in the ambient light levels for each lighting fixture in the second group of lighting fixtures to determine the potential lighting contribution.

18. The lighting fixture of claim 17 wherein when determining the potential lighting contribution, the circuitry is configured to:
for each lighting fixture in the second group of lighting fixtures:
instruct the lighting fixtures in the second group of lighting fixtures to emit light at the full output level while other lighting fixtures in the second group of lighting fixtures remain at a set output level;
measure the ambient light level at the full output level when the lighting fixture in the second group of lighting fixtures is emitting light at the full output level;
instruct the lighting fixtures in the second group of lighting fixtures to not emit light while other lighting fixtures in the second group of lighting fixtures remain at the set output level; and
measure the ambient light level when the lighting fixture in the second group of lighting fixtures is not emitting light.

19. The lighting fixture of claim 16 wherein to determine the potential lighting contribution, the circuitry is further configured to determine a difference in ambient light levels between all of the lighting fixtures in the second group of lighting fixtures emitting light at the full output level and not emitting light, wherein the difference in the ambient light levels corresponds to the potential lighting contribution.

20. The lighting fixture of claim 16 wherein the circuitry is configured to receive the local dimming information that controls the dimming level for the first group of lighting fixtures, and the target level is based on the adjusted reference level and the local dimming information.

21. The lighting fixture of claim 20 wherein the local dimming information corresponds to a percentage of the full output level for the light source, and the target level corresponds to the percentage of the full output level multiplied by the adjusted reference level.

* * * * *